US010776142B1

(12) United States Patent
Seshadri et al.

(10) Patent No.: US 10,776,142 B1
(45) Date of Patent: Sep. 15, 2020

(54) RECONFIGURING PROGRAMMABLE HARDWARE WHEN A VIRTUAL MACHINE IS ACTIVE

(71) Applicant: Amazon Technologies, Inc., Seattle, WA (US)

(72) Inventors: Kiran Kalkunte Seshadri, Cedar Park, TX (US); Asif Khan, Cedar Park, TX (US); Nafea Bshara, San Jose, CA (US)

(73) Assignee: Amazon Technologies, Inc., Seattle, WA (US)

( * ) Notice: Subject to any disclaimer, the term of this patent is extended or adjusted under 35 U.S.C. 154(b) by 56 days.

(21) Appl. No.: 15/840,807

(22) Filed: Dec. 13, 2017

(51) Int. Cl.
*G06F 9/455* (2018.01)
*G06F 9/445* (2018.01)
*G06F 30/331* (2020.01)
*G06F 8/656* (2018.01)
*G06F 9/38* (2018.01)

(52) U.S. Cl.
CPC .......... *G06F 9/45545* (2013.01); *G06F 8/656* (2018.02); *G06F 9/3877* (2013.01); *G06F 9/44505* (2013.01); *G06F 30/331* (2020.01)

(58) Field of Classification Search
CPC ............. G06F 9/45545; G06F 9/44505; G06F 9/3887; G06F 8/656; G06F 30/331
See application file for complete search history.

(56) References Cited

U.S. PATENT DOCUMENTS 8,145,894 B1 3/2012 Casselman
2010/0312982 A1* 12/2010 Ichikawa ............ G06F 9/45558
711/170
2012/0005473 A1 1/2012 Hofstee et al.
2013/0167028 A1 6/2013 Goldman et al.
2014/0007230 A1 1/2014 Jani et al.
2015/0205629 A1* 7/2015 Kruglick ............. G06F 9/45558
718/1
2016/0172027 A1 6/2016 Tahmasebian et al.

(Continued)

OTHER PUBLICATIONS

U.S. Appl. No. 15/645,624, filed Jul. 10, 2017, Titled: Reconfiguring Programmable Hardware.

*Primary Examiner* — Jacob D Dascomb
(74) *Attorney, Agent, or Firm* — Kilpatrick Townsend & Stockton LLP

(57) ABSTRACT

Disclosed herein are techniques for configuring a shell logic in a configurable computing system while a client virtual machine (VM) using the shell logic is active. In certain embodiments, a configurable device includes a client configurable circuit associated with a client virtual machine, and a shell logic configured to isolate the client configurable circuit. The shell logic includes a reconfigurable shell, an isolation logic, and a packet processing logic. The isolation logic is configured to disable communication between the reconfigurable shell and the client virtual machine when the reconfigurable shell is being reconfigured. The packet processing logic is configured to service transactions between the client virtual machine and the configurable device after the communication between the reconfigurable shell and the client virtual machine is disabled. In some embodiments, the shell logic also includes a mailbox configured to enable communication between the client virtual machine and a management virtual machine.

27 Claims, 8 Drawing Sheets

(56) References Cited

U.S. PATENT DOCUMENTS

| | | | |
|---|---|---|---|
| 2016/0321113 A1* | 11/2016 | Pinto | G06F 9/45533 |
| 2018/0074987 A1 | 3/2018 | Alley et al. | |
| 2018/0081701 A1* | 3/2018 | Chan | G06F 9/44505 |
| 2018/0205553 A1 | 7/2018 | Hoppert et al. | |
| 2018/0295192 A1* | 10/2018 | Dutta | G06F 9/45558 |

* cited by examiner

RECONFIGURING PROGRAMMABLE HARDWARE WHEN A VIRTUAL MACHINE IS ACTIVE

BACKGROUND

A computing system, such as a cloud computing system, may include networked computing resources (e.g., hardware and software) available for use by clients. Clients may access the networked computing resources via a network, such as the Internet, to configure the networked computing resources to provide a service or to access a service provided by another client. Cloud computing techniques can facilitate more efficient use of networked computing resources by, for example, enabling the resources to be allocated as needed between clients and/or by allocating hardware in a time sliced manner to several clients concurrently. A computing service provider can provide systems with varying combinations of processing performance, memory capacity and performance, storage capacity and performance, and networking capacity and performance. Thus, a client can select a computing system that can potentially be more efficient at executing a particular task.

In certain cloud computing environments, some clients may desire to use hardware that is proprietary or highly specialized for executing their computing tasks. Thus, the computing service provider can be challenged to provide specialized computing hardware for these clients while keeping a mix of generalized resources so that the resources can be efficiently allocated among the different users. In addition, enabling use of client defined hardware within a cloud computing environment can raise performance, security, and/or stability concerns.

BRIEF DESCRIPTION OF THE DRAWINGS

Various embodiments in accordance with the present disclosure will be described with reference to the drawings, in which.

DETAILED DESCRIPTION

Figure 1:
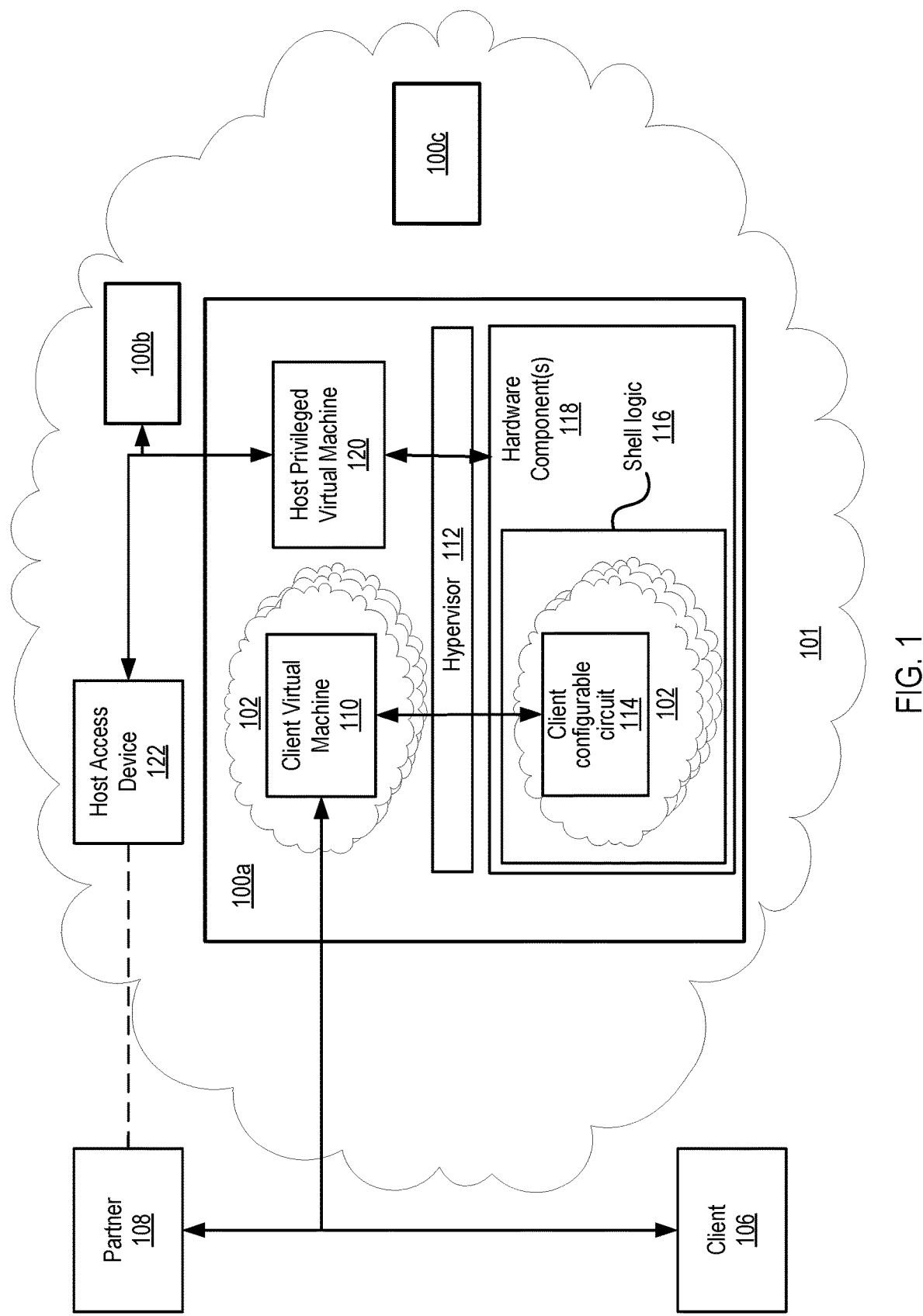
FIG. 1 illustrates an example cloud computing system in an example host domain, according to certain embodiments.

Disclosed herein are techniques for configuring a configurable shell logic in a configurable computing system while a client virtual machine (VM) using the shell logic is active. The configurable computing system may include a client configurable circuit. The client configurable circuit may be programmed with a shell logic, which may be provided and controlled by a computing service provider. The shell logic may include a static shell (SL), and a reconfigurable shell (RL) that can be reconfigured for different customer logics. While the reconfigurable shell is reconfigured for various reasons, protections may be needed in order to prevent a client virtual machine or the client configurable circuit from evading protections built within the shell logic. According to some implementations, rather than applying the protections by suspending or stopping the client virtual machine or suspending the communications between the client virtual machine and the client configurable circuit and the reconfigurable shell until the reconfigurable shell is reprogrammed, the static shell may include circuits that can handle requests from the client virtual machine or a host that executes the client virtual machine, such as packet processing or memory access requests, thus enabling the client virtual machine to be active while the reconfigurable shell is being reconfigured. In addition, the static shell may also include circuits for isolating the reconfigurable shell from the static shell, the client virtual machine, and other circuits of the computing system (e.g., the host). A state machine and a reconfiguration logic may also be included in the static shell to control the process of isolating the reconfigurable shell, reconfiguring the reconfigurable shell, and de-isolating the reconfigurable shell. The static shell may also enable the communication between the client virtual machine and a management virtual machine (or hypervisor). In this way, the client virtual machine can remain alive to perform functions other than accessing the reconfigurable shell, while the reconfigurable shell and/or the customer logic are being switched or reconfigured.

In the following description, various embodiments will be described. For purposes of explanation, specific configurations and details are set forth in order to provide a thorough understanding of the embodiments. However, it will also be apparent to one skilled in the art that the embodiments may be practiced without the specific details. Furthermore, well-known features may be omitted or simplified in order not to obscure the embodiments being described.

As used herein, a logic may be implemented using a circuit and/or the associated software or firmware for performing certain functions. In one example, a logic may be implemented using a programmable circuit (e.g., an FPGA) and a configuration file (e.g., a bit stream) stored in a nonvolatile memory. After the configuration, the circuit (e.g., the programmable circuit) may be referred to as a logic circuit for performing certain functions. As used herein, a shell may refer to a wrapper of a configurable circuit, where the wrapper may isolate the configurable circuit and act as a communication interface for the configurable circuit. In some implementations, the shell may perform other functions, such as enforcing security, managing the configuration of the configurable circuit, and facilitating the configurable circuit to perform a user function. In some implementations, a shell may be configurable at boot time or during run time.

In some computing systems, such as cloud computing systems, some clients may desire to have specialized hardware computing resources that may enable more efficient processing of certain client data. One solution for providing specialized computing resources in a multi-tenant cloud environment is to provide networked computing resources including a client configurable circuit on an end point device, such as by providing a computing device with an add-in card or other peripheral device including a field-programmable gate array (FPGA). The client configurable circuit may be hardware that can be programmed or configured to perform a logic function specified by configuration data that is applied to or loaded on the configurable circuit. For example, a client of a computing system may provide a specification (such as source code written in a hardware description language or a configuration file) for configuring the client configurable circuit, and the client configurable circuit may then be configured according to the specification to perform a task for the client. For example, the client can program the client configurable circuit so that it functions as a hardware accelerator that is tightly coupled to the computing device. As a specific example, the hardware accelerator can be accessible via a local interconnect, such as Peripheral Component Interconnect Express (PCI-Express or PCIe), of the computing device. The client can execute an application on the computing device, when at least some tasks of the application can be performed by the hardware accelerator using PCIe commands. By tightly coupling the hardware accelerator to the computing device, the latency between the hardware accelerator and the computing device can be reduced, which may potentially increase the processing speed of the application. In certain implementations, the client configurable circuit can be programmed with a shell logic that may be provided and controlled by a computing service provider.

Allowing a client of a cloud computing service to access low-level hardware of a cloud computing system may potentially introduce security, performance, and privacy issues within the cloud computing system. For example, a faulty or malicious design from one client could potentially read or corrupt data from other clients if the configured logic is able to read from and/or write to memory of other clients' memory spaces. As another example, a faulty, malicious, or less-secure design from one client could potentially cause a denial of service to other clients if the configured logic causes one or more devices within the cloud computing system to malfunction (e.g., crash, hang, or reboot) or be denied access to system resources.

A computing service provider can potentially increase the security, performance, privacy, and/or availability of the computing resources by wrapping or encapsulating the client configurable circuit within a shell logic provided and controlled by the computing service provider. Encapsulating the client configurable circuit may include limiting or restricting the client configurable circuit's access to configuration resources, physical interfaces, hard macros, and various peripherals of a computing device using a protection logic. The shell logic can provide a framework for the client configurable circuit to work within. In particular, the shell logic can communicate with the client configurable circuit and constrain the functionality of the client configurable circuit. For example, the shell logic can perform bridging functions between the local interconnect (e.g., the PCIe interconnect) and the client configurable circuit so that the client configurable circuit cannot directly control the signaling on the local interconnect. The shell logic may be responsible for forming packets or bus commands on the local interconnect and ensuring that certain protocol requirements are met. By controlling commands on the local interconnect, the shell logic can potentially prevent malformed commands or to prevent commands from being sent to undesired locations.

In many applications, a client virtual machine may desire to change the shell logic for various reasons. For example, during operations, a client virtual machine may desire to perform additional or different user functions that may use different customer logics and shell logics. In one specific example, an active client virtual machine that performs memory mapping using a direct memory access (DMA) interface during a first time period may desire to perform data streaming during a second time period. The memory mapping using the DMA interface and data streaming may use different customer logics that may work within different shell logics. Thus, it may be desirable to switch from a memory-mapping direct memory access (DMA) interface shell to a streaming interface shell. In another example, the shell logic may need to be switched from an existing shell to a bug-recovering shell in order to recover the existing shell or the client virtual machine from a failure (e.g., a shell or client virtual machine hang) caused by bug(s) in the existing shell. Thus, in certain implementations, the circuit for the shell logic may also include reconfigurable circuits that can be reprogrammed or reconfigured for different shell logics. While the shell logic is being changed or reconfigured, the protection logic may not be available, and thus a client virtual machine and/or customer logic within the client configurable circuit may potentially cause one or more computing devices within the computing system to malfunction (e.g., crash, hang, or reboot) or be denied to receive network services. For example, a faulty or malicious design from one client could potentially read and/or corrupt data from another client if the configured logic is able to read and/or write memory of the other client's memory space.

As such, additional protections may be needed to prevent the client virtual machine or the customer logic from evading the protections built within the shell logic while the shell logic is reprogrammed. In some implementations, such additional protections may include, for example, suspending or stopping the client virtual machine, suspending communications between the client virtual machine and the shell logic and/or the customer logic until the shell logic is reconfigured. However, suspending or stopping the client virtual machine may suspend or stop the client applications. Suspending and resuming the client virtual machine may use computing resources that may otherwise be used for other purposes. Suspending the communications between the client virtual machine and the shell logic and/or the customer logic may affect the performance of the computing system when, for example, the requests from the client virtual machine running on the host are not served within a certain time period, which may starve the client virtual machine and cause the client virtual machine to stop.

Techniques disclosed herein enable the configuration of a configurable shell logic in a configurable computing system while a client virtual machine associated with the configurable shell logic is active. In some implementations, the shell logic may include a static shell (SL) that may not change during shell switching, and a reconfigurable shell (RL) that may be reconfigured during shell switching. When the reconfigurable shell is reconfigured during shell switching, a circuit in the static shell may handle requests from the client virtual machine or a host, such as packet processing or memory access requests, thus enabling the client virtual machine to be active during shell switching. The static shell may also include circuits for isolating the reconfigurable shell from the client virtual machine, the static shell, and other circuits of the computing system (e.g., the host) and for bridging the communications between the client virtual machine and a management virtual machine on the host. A state machine and a reconfiguration logic may also be included in the static shell to control the process of isolating the reconfigurable shell, reconfiguring the reconfigurable shell, de-isolating the reconfigurable shell, and handling the transaction requests from the client virtual machine or other hardware/software components on the host.

FIG. 1 illustrates an example computing device 100a in an example host domain 101 in a cloud computing system, according to certain embodiments. Host domain 101 in the cloud computing system may provide one or more cloud enabled services to a client 106 or a type of client referred to as a partner device 108. One or more computing devices 100a-100c and host access device 122 may each reside within the cloud computing system, and more specifically, within host domain 101. Partner device 108 may be a client of host domain 101 that is privileged to utilize cloud resources to provide a service. For example, partner device 108 can be used to request, via host access device 122, one or more resources of the cloud computing system to enable a service. Partner device 108 may have more privileged access to the cloud computing system than client 106, which may be a user of a service of partner device 108.

Computing device 100a within host domain 101 may include hardware component(s) 118, which may be used to implement a host privileged virtual machine 120 (also referred to as a management virtual machine) and one or more client virtual machines 110 on a hypervisor 112 to provide services to one or more clients. Hardware component(s) 118 may include processors, memory, fixed function hardware, peripherals, and/or client configurable circuit 114. One or more of hardware components 118 may be logically abstracted, via hypervisor 112, into a client virtual machine 110 that client 106 or partner device 108 is privileged to access.

Hypervisor 112 can manage client virtual machine 110 and other virtual machines that may operate within host domain 101, such as host privileged virtual machine 120 and other client virtual machines running on computing devices 100b and 100c. Host privileged virtual machine 120 may be a privileged type of virtual machine that may have direct access to hardware component(s) 118, drivers, or an operating system of computing device 100a. The operating system may manage/schedule interactions between logical virtual machines and physical components within host domain 101. Client virtual machine 110 can be one of several virtual machines operating within computing device 100a and can be logically separated from hardware devices of host domain 101 that services client virtual machine 110.

The logical separation of client virtual machine 110 may be accomplished by logically isolating client virtual machine 110 into a client domain 102 that is separate from host domain 101 of the cloud computing system. Client domain 102 may include associated virtual or physical components, such as a virtual machine running on a host and the underlying customer logic implemented in client configurable circuit 114. Hypervisor 112 may reside on the host domain 101 but may have access to client domain 102, whereas virtual or physical devices of client domain 102 may be prevented from accessing other virtual or physical devices of host domain 101 (or other client domains).

Client configurable circuit 114 may be configured and managed within client domain 102 in the cloud computing system through a shell logic 116 as described in more detail below. Client configurable circuit 114 may include configurable circuits that can be used by partner device 108, for example, to implement and have access to a hardware device within the cloud computing system. In one example, client configurable circuit 114 can be configured to act as a hardware accelerator. The hardware accelerator can be created using programmable logic device(s) such that multiple clients may be able to configure differing accelerators using a same underlying hardware device. As described above, client configurable circuit 114 may reside within client domain 102. However, access between client virtual machine 110 and client configurable circuit 114 may pass through host domain 101 of the cloud computing system so that the cloud computing system can manage and monitor access to the underlying hardware components of client configurable circuit 114 for implementing the customer logic.

A computing service provider can potentially increase the security and/or availability of the computing resources by wrapping or encapsulating the client configurable logic within a shell logic. Encapsulating the client configurable logic can limit or restrict the client configurable logic's access to configuration resources, physical interfaces, hard macros, and various peripherals of a computing device. For example, the computing service provider may manage the programming of the client configurable circuit using the shell logic, which may provide a framework for the client configurable logic to work within. In particular, the shell logic may communicate with the client configurable logic and constrain the functionality of the client configurable logic. For example, the shell logic may perform bridging functions between the local interconnect (e.g., the PCIe interconnect) and the client configurable logic so that the customer logic cannot directly control the signaling on the local interconnect. The shell logic may virtualize the client configurable circuit so that the client configurable logic operates as if it is communicating directly with a virtual machine. The shell logic may also be responsible for forming packets or bus transactions on the local interconnect and ensuring that certain protocol requirements are met. By controlling the transactions on the local interconnect, the shell logic may potentially prevent malformed transactions or prevent the transactions from reaching undesired locations. For example, the shell logic may isolate a configuration access port so that the customer logic cannot cause the client configurable circuit to be reprogrammed without using services provided by the computing service provider (e.g., the shell logic).

Figure 2:
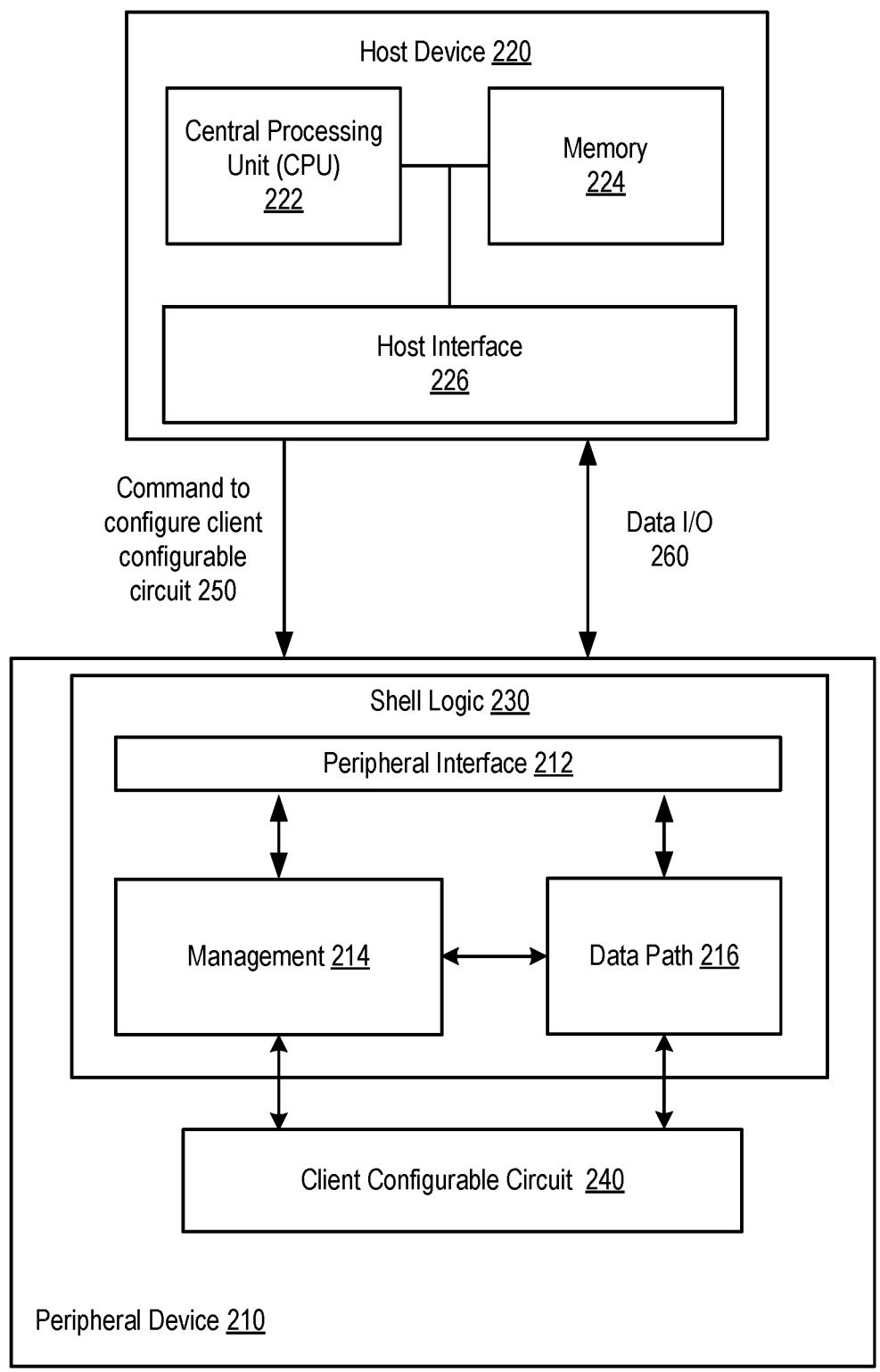
FIG. 2 is a simplified block diagram of an example computing system including a client configurable circuit, according to certain embodiments.

FIG. 2 is a simplified diagram of an example computing device 200 including a client configurable circuit, according to certain embodiments. Computing device 200 may be an example implementation of computing devices 100a-100c. Computing device 200 may include a peripheral device 210 (e.g., an end point) and a host device 220 (e.g., a server). Computing device 200 may be used to implement client virtual machines (e.g., client virtual machine 110) and/or customer logics (e.g., implemented using client configurable circuit 114 of FIG. 1).

Host device 220 can include a central processing unit (CPU) 222, memory 224, and a host interface 226. CPU 222 may be used to execute instructions stored in memory 224. For example, memory 224 may be loaded with instructions for all or a portion of the cloud computing service and CPU 222 can execute the instructions of the cloud computing service. The cloud computing service may communicate with a hardware accelerator of peripheral device 210 by issuing commands (e.g., transaction requests) using host interface 226. A command can be a read request, a write request, a read response, a message, an interrupt, or other types of data transmittal. The command can occur on a bus shared by multiple components. Specifically, parameters of signal lines of the bus can be modulated to transfer data on the bus using a communications protocol of the bus. The command can occur over one or more phases, such as an address phase and one or more data phases. Additionally or alternatively, the command can occur using one or more serial lines of a point-to-point interconnect that connects two components. Specifically, the command may be sent in a packet that is transmitted over the point-to-point interconnect.

Host interface 226 can include a bridge for communicating between CPU 222 (e.g., using a local or front-side interconnect) and peripheral devices (e.g., using a peripheral or expansion interconnect). Specifically, host interface 226 can be connected to a physical interconnect that is used to connect host device 220 to peripheral device 210 and/or to other components. For example, the physical interconnect can be an expansion bus for connecting multiple components together using a shared parallel bus or serial point-to-point links. As a specific example, the physical interconnect can be Peripheral Component Interconnect (PCI), PCI express (PCIe), or another physical interconnect that couples host device 220 to peripheral device 210. Thus, host device 220 and peripheral device 210 can communicate using, for example, PCI bus commands or PCIe packets.

Peripheral device 210 may include a client configurable circuit 240 that may be used to implement a customer logic for the client. Client configurable circuit 240 can include hardware that is configurable to implement, for example, a hardware accelerator or a memory device. In other words, client configurable circuit 240 may include logic that can be configured or programmed into a customer logic to perform a given user function. For example, client configurable circuit 240 may include programmable logic blocks comprising combinational logic and/or look-up tables (LUTs) and sequential logic elements (such as flip-flops and/or latches), programmable routing and clocking resources, programmable distributed and block random access memories (RAMs), digital signal processing (DSP) bit slices, and/or programmable input/output pins.

Peripheral device 210 may also include a shell logic 230 for configuring and managing client configurable circuit 240. Shell logic 230 may be provided and controlled by the computing service providers and may be suitable for using with a certain type of customer logics. Shell logic 230 may include a peripheral interface 212, a management module 214, and a data path module 216. Shell logic 230 can be used to encapsulate client configurable circuit 240. For example, client configurable circuit 240 can interface with various components of shell logic 230 using predefined interfaces so that client configurable circuit 240 is restricted in access to other components of peripheral device 210 or host device 220. Shell logic 230 can include logics that can isolate different components of peripheral device 210 or host device 220 from client configurable circuit 240. As one example, hard macros of peripheral device 210 (such as a configuration access port or circuits for signaling on the physical interconnect) can be masked so that client configurable circuit 240 cannot directly access the hard macros.

Peripheral interface 212 in shell logic 230 may be used for communicating with the host device 220. Specifically, peripheral interface 212 can be used to enable communications with the host device 220 using a communication protocol and a physical interconnect. As one example, host device 220 may communicate with peripheral device 210 using a command including an address associated with peripheral device 210. Similarly, peripheral device 210 may communicate with host device 220 using a command including an address associated with host device 220. The addresses associated with various devices connected to host interface 226 may be predefined and programmed into the devices. Additionally or alternatively, the communication protocol can include an enumeration sequence where the devices connected to host interface 226 may be queried and addresses may be assigned to each of the devices as part of the enumeration sequence. After enumeration, peripheral interface 212 may route commands to functional modules or blocks of peripheral device 210 based on an address of the command.

Management module 214 in shell logic 230 may be used for managing and configuring peripheral device 210. Commands and data can be sent from host device 220 to management module 214 using commands that target the address range of management module 214. For example, host device 220 can generate commands (e.g., transaction requests) to transfer data (e.g., configuration data) and/or write control registers of peripheral device 210 that are mapped to one or more addresses within the address range of management module 214. Writing the control registers may cause peripheral device 210 to perform operations, such as configuring and managing peripheral device 210. As a specific example, client configuration data corresponding to a customer logic to be implemented in client configurable circuit 240 can be transmitted from host device 220 to peripheral device 210 in one or more commands between host interface 226 and peripheral interface 212. A command 250 to configure client configurable circuit 240 with the client configuration data can be transmitted from host device 220 to peripheral device 210. Specifically, command 250 may write a value to a control register mapped to the address space of management module 214 that may trigger configuring client configurable circuit 240. For example, the client configuration data can be streamed into or loaded onto client configurable circuit 240, for example, from host device 220 or on-chip or off-chip memory accessible by peripheral device 210, while commands including the client configuration data are processed by management module 214.

Data path module 216 in shell logic 230 may be used to exchange information (e.g., data input/output 260) between host device 220 and peripheral device 210. Specifically, commands and data may be sent from host device 220 to data path module 216 using commands that target the address range of data path module 216. Similarly, peripheral device 210 may communicate with host device 220 using commands including an address associated with host device 220. Data path module 216 may also act as a translation layer between peripheral interface 212 and client configurable circuit 240. Specifically, data path module 216 may include an interface for receiving information from client configurable circuit 240, and data path module 216 may format the information for transmission from peripheral interface 212. Formatting the information can include generating control information for one or more commands and partitioning data into blocks that are sized to meet protocol specifications. Thus, data path module 216 can be interposed between client configurable circuit 240 and the physical interconnect (e.g., the PCIe bus). In this manner, client configurable circuit 240 can potentially be blocked from formatting commands and directly controlling the signals used to drive the physical interconnect so that client configurable circuit 240 cannot be used to inadvertently or maliciously violate protocols of the physical interconnect.

As described above, the physical interconnect that couples host device 220 to peripheral device 210 may include a PCI, PCIe, or any other interconnect. In digital interconnect protocols, such as PCIe or Advanced eXtensible Interface (AXI), different types of transactions may originate at the transaction layer. For example, PCIe may support four types of transactions that may originate at the transaction layer: memory, I/O, configuration, and message. Memory transactions (e.g., memory reads and writes) may be the basic method of transferring data. I/O transactions (e.g., I/O reads and writes) may be used for backward compatibility with PCI or ISA. Configuration transactions (e.g., configuration reads and writes) may be used by a PCIe root complex to configure the system during power-up. Message transactions may be used to send interrupts, error conditions, and other information through the physical interconnect.

In some implementations, the shell logic for encapsulating the client configurable circuit may include a static portion (referred to as static shell (SL)) and a reconfigurable portion (referred to as reconfigurable shell (RL)). The static shell can include static host logic, which may include functions that may not change for many different customer logics. One example of such static host logic may include any PCIe bus control functions. Another example may include a mailbox function through which a client virtual machine can communicate with a management virtual machine (or a management hypervisor). The reconfigurable shell can include features, such as the client configurable circuit management hardware. The reconfigurable shell can also include protection logic used to ensure that the customer logic within the client configurable circuit in a peripheral device would not be used maliciously to impact the host device or to cause security breach.

A client may choose to load different customer logics within the client configurable circuit and the reconfigurable shell for different user applications. For example, a client virtual machine may use an identifier in association with an API request, where the identifier may point to a customer logic and a reconfigurable shell that may be associated with the customer logic. When such a request is received, a first customer logic executing on the client configurable circuit may be replaced with a second customer logic, and, in many cases, the shell logic function (or circuit) on the reconfigurable shell may also be replaced by a new shell logic function (or circuit) to work with the second customer logic. During the transition between the customer logics and the transition between the reconfigurable shell functions, security issues can arise. For example, the first customer logic may perform unauthorized operations if the reconfigurable shell is inactive because the reconfigurable shell is being replaced. Specifically, the protection logic within the reconfigurable shell may be temporarily inactive.

Thus, in some computing systems with client configurable circuits in a peripheral device (i.e., end point), in order to protect the host during a transition that replaces the first customer logic with the second customer logic, the following operations may be performed in response to a request from a client virtual machine to load a new customer logic. First, the customer account permissions can be checked. A check may then be performed to determine whether an appropriate reconfigurable shell is already loaded and, if so, then the customer logic can be loaded. Otherwise, a check can be made to ensure that the load of the new customer logic can be performed. For example, the load of the new customer logic can be performed if the reconfigurable shell for the new customer logic is available and host configurable circuits in the peripheral device can be used to implement the reconfigurable shell. A response can be generated to inform the client virtual machine that the load request is accepted. The sequence for configuring the customer logic and the reconfigurable shell associated with the customer logic can include deactivating at least a portion of the peripheral device used for the client virtual machine, which can be accomplished through, for example, pausing or stopping the client virtual machine or using a driver on the client virtual machine to effectively detach (e.g., unmap) the peripheral device from the client virtual machine. Existing customer logic within the client configurable circuit in the peripheral device can then be cleared or deactivated. Subsequently, the reconfigurable shell can then be configured on the host configurable circuits, and the customer logic can be configured on the client configurable circuits and activated using the reconfigurable shell. The portion of the peripheral device used for the client virtual machine can then be activated, either through resuming or restarting the client virtual machine or reattaching the peripheral device to the client virtual machine.

Figure 3:
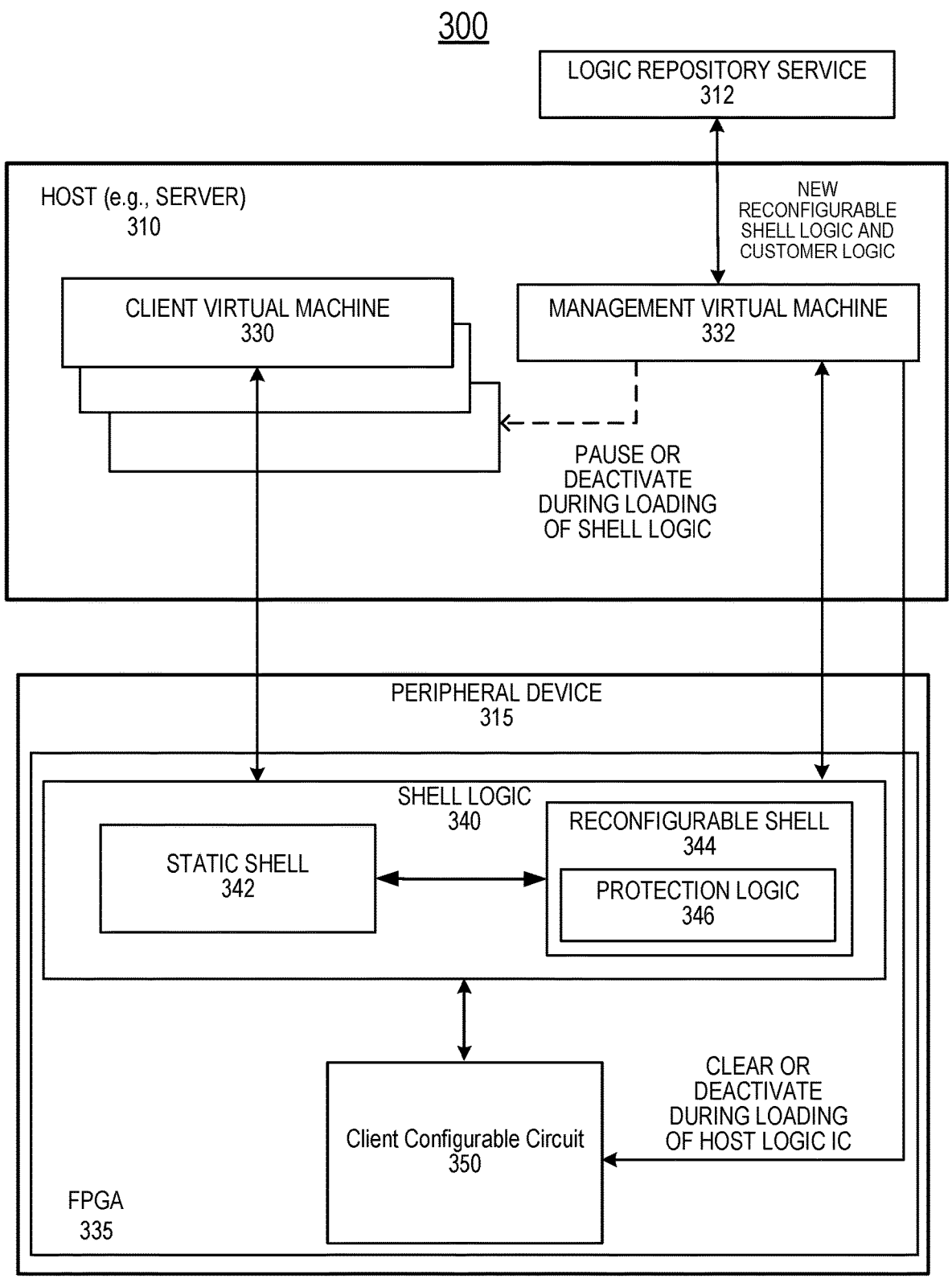
FIG. 3 is a simplified block diagram of an example computing system including a client configurable circuit and a shell logic.

FIG. 3 is a simplified block diagram of an example computing system 300 including a client configurable circuit 350 and a shell logic 340. Computing system 300 may be used for virtualizing client configurable circuit 350. Computing system 300 may be coupled to a logic repository service 312 via a network (not shown). Logic repository service 312 may be a service from which the customer logic and/or the shell logic provided by the computing service provider can be retrieved and loaded into computing system 300. Computing system 300 may include a software portion and a hardware portion. The software portion may include a plurality of client virtual machines 330 and a management virtual machine 332 (or management hypervisor). Management virtual machine 332 may partition resources of computing system 300 for client virtual machines 330 such that client virtual machines 330 can share the processing capacity, memory, and other resources of computing system 300. The hardware portion of computing system 300 may include a host 310 (e.g., a server including a processor and memory) and one or more peripheral devices 315.

Peripheral device 315 may include shell logic 340 and client configurable circuit 350. Shell logic 340 and client configurable circuit 350 may include programmable integrated circuits (ICs), such as field programmable gate arrays (FPGAs) or programmable array logics (PALs), or may be part of one or more FPGAs on peripheral devices 315. For example, in some embodiments, shell logic 340 and client configurable circuit 350 may be implemented on an FPGA 335 residing on peripheral device 315. In some embodiments, shell logic 340 and client configurable circuit 350 may be implemented on two or more FPGAs residing on peripheral device 315. Peripheral device 315 may also include some other functional blocks shown or not shown in FIG. 3. For example, in some embodiments, peripheral device 315 may include one or more hard macros. A hard macro may include hardwired circuits that can perform a specific function. A hard macro may be available to perform the predefined function when peripheral device 315 is powered on. In various embodiments, the hard macros may include, for example, a configuration access port (CAP) for configuring shell logic 340 and/or client configurable circuit 350, a serializer-deserializer transceiver (SERDES) for communicating serial data, a memory or dynamic random access memory (DRAM) controller for signaling and controlling off-chip memory (such as a double data rate (DDR) DRAM), and a storage controller for signaling and controlling a storage device. Hard macros for other types of communication ports can also be used, including, but are not limited to, Ethernet, a ring topology, or other types of networking interfaces.

Shell logic 340 on peripheral device 315 may perform security functionality, monitoring functionality, etc. for example, shell logic 340 may include a logic deployed by the computing service provider on peripheral device 315 to enforce some level of device manageability and security. Shell logic 340 may provide encapsulation or sandboxing of client configurable circuit 350 so that one client may not obtain secure information associated with the operation of another client's customer logic. In some implementations, shell logic 340 may include a static shell 342 and a reconfigurable shell 344. Static shell 342 may include logic elements that can be configured at boot time by loading a firmware or configuration file from a non-volatile storage device, such as a flash device or a ROM, or other sources. For example, in some implementations, static shell 342 may be implemented on an FPGA. Static shell 342 may not be modified unless an externally controlled reset signal or a power cycle occurs. Reconfigurable shell 344 may include reconfigurable (or programmable) logic elements that can be reconfigured at runtime. For example, reconfigurable shell 344 can be dynamically changed in response to one of the client virtual machines 330 requesting an update to the configurable logic within reconfigurable shell 344 and/or client configurable circuit 350. Shell logic 340 may protect the system from attacks (e.g., PCIe level attacks) by, for example, controlling the interface between host 310 and peripheral device 315. In one specific example, shell logic 340 may control the PCIe interface(s) including the PCIe addresses and PCIe Bus/Dev/Func (or Alternative Routing-ID Interpretation (ARI)). In some implementations, reconfigurable shell 344 may include a protection logic 346 for device management and security enforcement.

In some implementations, static shell 342 may include static circuits, such as hard macros, hard wired circuits, and/or configurable circuits that can be configured or initialized at boot time. For example, shell configuration data specifying the functionality of the static shell may be loaded from an on-chip or off-chip non-volatile memory device, such as a flash memory device or ROM, during a boot-up sequence. The boot-up sequence can include detecting a power event (such as by detecting that a supply voltage has transitioned from below a threshold value to above the threshold value) and de-asserting a reset signal in response to the power event. An initialization sequence can then be triggered in response to the power event or the reset being de-asserted. The initialization sequence can include reading shell configuration data stored on the non-volatile memory device and loading the shell configuration data onto the configurable circuits so that at least a portion of the configurable circuits can be configured into the static shell or to can be configured to perform the functionality of the static shell. After the static shell is loaded on the configurable circuits, the configurable circuits may transition from a loading state to an operational state to perform the functionality of the static shell. The static shell may remain active until, for example, peripheral device 315 is reset or powered down.

Reconfigurable shell 344 may include programmable circuits that can be reconfigured during runtime. Reconfigurable shell 344 may be configured after the static shell has been loaded or initialized. The shell configuration data corresponding to the reconfigurable shell can be stored in an on-chip or off-chip memory, or can be stored in logic repository service 312 and received or streamed through an interface. In some implementations, reconfigurable shell 344 may be divided into non-overlapping regions, which mat interface with static shell 342. For example, the reconfigurable regions can be arranged in an array or other regular or semi-regular structure. The array structure may include holes or blockages where hard macros may be placed within the array structure. The different reconfigurable regions may communicate with each other, the static shell, and the hard macros using signal lines that may be part of static shell 342. The different reconfigurable regions can be configured at different points in time. For example, a first reconfigurable region may be configured at a first point in time and a second reconfigurable region can be configured at a second point in time.

Client configurable circuit 350 may be reconfigured and controlled by a client associated with a client virtual machine 330 running on host 310. A client may upload a configuration file (e.g., firmware, hardware description language (HDL) file, bit streams, etc.) with customer defined logic to the logic repository service 312 for use by computing system 300. Through management virtual machine 332, the customer defined logic can be downloaded from logic repository service 312 and sent to peripheral device 315 for programming or configuring client configurable circuit 350. The programming of client configurable circuit 350 may be controlled and managed by shell logic 340. After client configurable circuit 350 is configured, client virtual machine 330 may be able to communicate with the customer defined logic implemented using client configurable circuit 350 via shell logic 340. Client configurable circuit 350 may be configured or programmed to perform various functions as desired by a client of a computing service provider. Client configurable circuit 350 can be programmed multiple times with different configurations, and thus can perform different hardware functions over the lifetime of peripheral device 315.

In some implementations, the functions of peripheral device 315 may be divided or categorized based upon the purpose or capabilities of the functions. For example, the functions may be categorized as control plane functions, data plane functions, and shared functions. The control plane functions may be used for management and configuration. For example, a control plane function may be used to monitor and restrict the capabilities of the data plane. The control plane functions may include shell logic 340. The control plane functions may be loaded onto peripheral device 315 prior to loading the data plane functions. The data plane functions may be used to manage data transfer between host 310 and the customer defined logic implemented using client configurable circuit 350. For example, a data plane function may be used to accelerate a client's application that is running on host 310. Shared functions can be used by both the control plane functions and the data plane functions.

By separating the functions of the control and data planes, the security and availability of host 310 and other computing devices in a computing system can potentially be increased. For example, the customer defined logic may not directly signal onto the physical interface to host 310 because the intermediary layers of the control plane may control the formatting and signaling of transactions at the physical interface. As another example, the customer defined logic may be prevented from using private peripherals which may be used to configure the peripheral device and/or to access management information that may be privileged. As another example, the customer defined logic may access hard macros of peripheral device 315 through the intermediary layers of the control plane so that any interaction between the customer defined logic and the hard macros may be controlled using the intermediary layers.

In some circumstances, client virtual machine 330 may request changing reconfigurable shell 344 with or without changing the customer defined logic within client configurable circuit 350. For example, client virtual machine 330 may desire to switch from a memory-mapping DMA interface shell to a data streaming interface shell. In some circumstances, the shell logic may need to replace an existing logic circuit for the reconfigurable shell with a new logic circuit for the reconfigurable shell or with a bug-recovering shell in order to fix bugs in the existing logic circuit for the reconfigurable shell or to recover the virtual machine or the reconfigurable shell from a failure caused by bugs in the existing logic circuit for the reconfigurable shell, without changing the customer defined logic within client configurable circuit 350. Changing reconfigurable shell 344 may result in some control plane functionality being offline during the transition period. With some control plane functions inactive, client virtual machine 330 and/or customer defined logic within client configurable circuit 350 may have access to privileges outside their authorized privileges.

In some implementations, to close such a potential security loophole, management virtual machine 332 may prevent the customer defined logic from communicating with other circuits of computing system 300. Such prevention may be implemented by clearing or deactivating the customer defined logic during the reconfiguration or reprogramming of reconfigurable shell 344 as shown in FIG. 3. In addition, in some implementations, during the transition period, management virtual machine 332 may pause or deactivate client virtual machine 330, as indicated in FIG. 3. Static shell 342 may remain active during the transition period to manage the reconfiguration of reconfigurable shell 344. In some implementations, communications may also continue between client virtual machine 330 and management virtual machine 332 through static shell 342. In some embodiments (e.g., for bug recovering), the customer defined logic may not need to be reprogrammed and can remain unchanged when reconfigurable shell 344 is switched or otherwise reconfigured. In such situations, the customer defined logic may still need to be prevented from communicating with other circuits for security reasons as described above.

Figure 4:
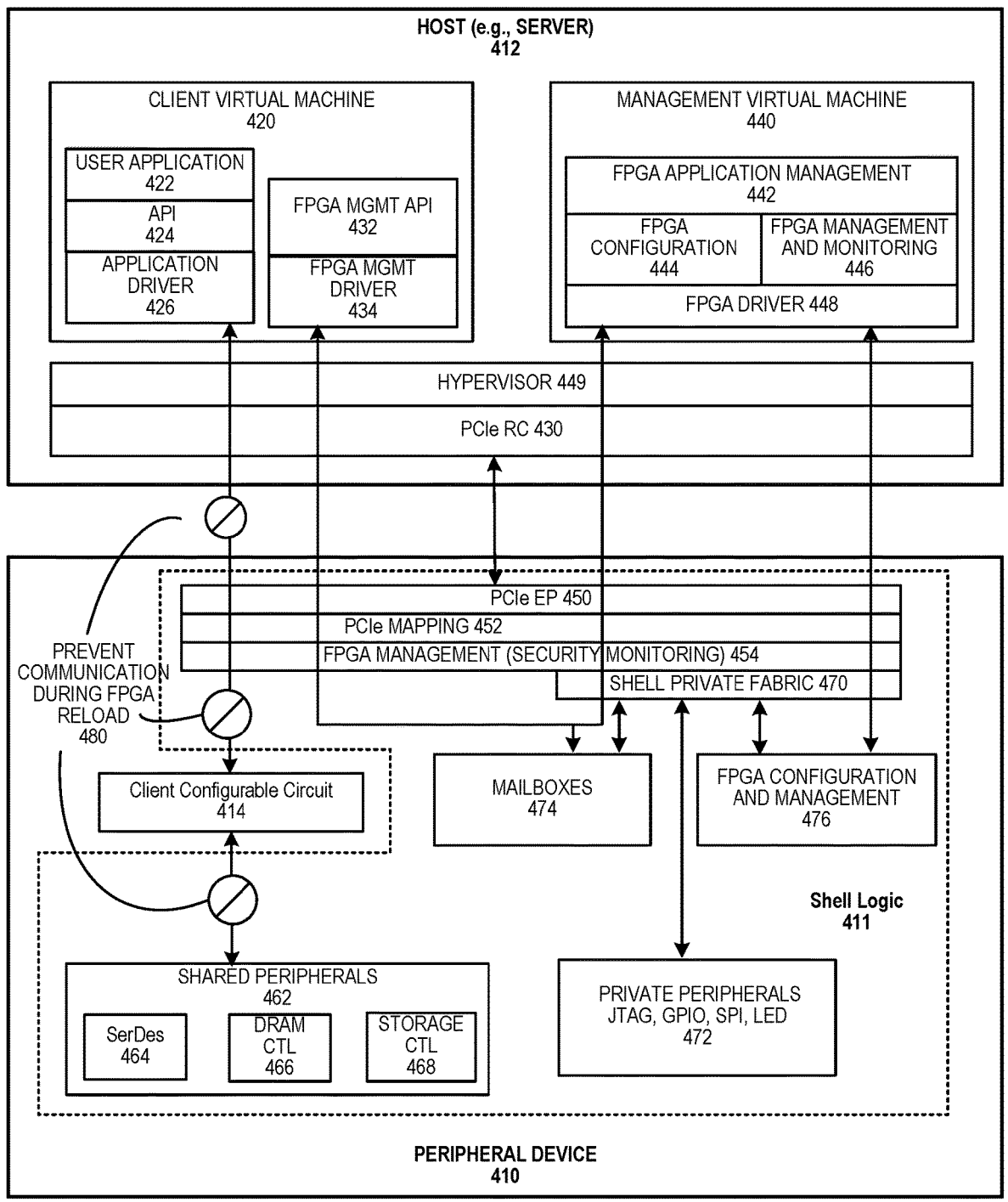
FIG. 4 is a diagram showing further details of an example computing system including a client configurable circuit and a shell logic.

FIG. 4 is a block diagram showing further details of an example computing system 400 including a client configurable circuit 414 and a shell logic 411. Computing system 400 may include a host 412 (e.g., a PCIe server) and a peripheral device 410 (e.g., a PCIe end point). Peripheral device 410 may include an FPGA or other types of programmable ICs, and may be positioned on one or more plug-in cards on host 412 or otherwise positioned on or connected to a motherboard of host 412.

Host 412 may execute one or more client virtual machines, such as a client virtual machine 420. In the example shown in FIG. 4, client virtual machine 420 may include applications that use the hardware programmed into client configurable circuit 414 within peripheral device 410. For example, client virtual machine 420 may include a user application 422, an API 424, and an application driver 426. User application 422 may send commands and receive requests to and from circuits in peripheral device 410, such as client configurable circuit 414 via API 424. API 424 may communicate the commands and requests between user application 422 and client configurable circuit 414 through application driver 426. In one example, application driver 426 may communicate through a PCIe root complex (RC) 430 on host 412. PCIe root complex 430 may connect a processor and memory subsystem on host 412 to a PCI switch fabric (not shown in FIG. 4) that may include one or more switching devices. Client virtual machine 420 may further include an FPGA management API 432 and an FPGA management driver 434, which can be used for the configuration and management of client configurable circuit 414. Although other virtual machines are not shown, each virtual machine may have its own FPGA management API and FPGA management driver for controlling its respective FPGA in the peripheral device.

Host 412 may include a management virtual machine 440 (or a management hypervisor) that can execute an FPGA application management application 442, an FPGA configuration application 444, and an FPGA management and monitoring application 446. These applications may communicate with and control the FPGAs on peripheral device 410 through an FPGA driver 448. Management virtual machine 440 may oversee and manage multiple virtual machines, including client virtual machine 420.

Client virtual machine 420 and management virtual machine 440 may execute on a hypervisor 449 (or kernel) running on underlying host hardware (not shown), such as a CPU and memory devices. Hypervisor 449 may allow client virtual machine 420 and management virtual machine 440 to communicate with the underlying host hardware. Hypervisor 449 may run directly on the host hardware to control the hardware and to manage the guest operating systems, or may run within an operating system environment. Examples of hypervisors may include Xen-based, Hyper-V, ESXi/ESX, Linux, or other hypervisors. Management virtual machine 440 can be part of hypervisor 449 or may be separate from hypervisor 449. In some implementations, management virtual machine 440 may include device drivers needed for accessing the hardware on host 412 or peripheral device 410. Client virtual machine 420 may run in one of several partitions that are logical units of isolation. Each partition may be allocated with its own portion of memory, CPU time, storage, etc. on computing system 400. Each partition may also include a virtual machine and its own guest operating system.

Shell logic 411 on peripheral device 410 may include multiple modules for configuring, managing, and communicating with client configurable circuit 414. For example, peripheral device 410 may include a PCIe end point 450 that may act as an end point to which PCIe root complex 430 can switch communications. Peripheral device 410 may include a PCIe mapping layer 452 that can differentiate transactions from host 412 bound for different functional blocks on peripheral device 410. Transactions may pass through an FPGA management layer 454, which may provide security and monitoring of the transactions to ensure that encapsulation is maintained between clients. For example, FPGA management layer 454 may potentially identify transactions or data that violate predefined rules and may generate an alert in response. Additionally or alternatively, FPGA management layer 454 may terminate any transactions that violate any predetermined criteria.

Certain communications may pass through a shell private fabric 470 for accessing private peripherals 472. Private peripherals 472 may include components that are only accessible by the computing service provider (e.g., through management virtual machine 440) and are not accessible by clients (e.g., through client virtual machine 420). Private peripherals 472 may include, for example, JTAG (e.g., IEEE 1149.1), general purpose I/O (GPIO), serial peripheral interface (SPI) flash memory, light emitting displays (LEDs), etc.

Shell logic 411 of peripheral device 410 may include mailboxes 474 that are accessible from either the control plane or the data plane described above. Specifically, mailboxes 474 may be used to pass messages and other information between the control plane and the data plane. Mailboxes 474 may include buffers, control registers (such as semaphores), and status registers. By using the mailboxes as an intermediary between the control plane and the data plane, isolation between the data plane and the control plane can potentially be increased, which can increase the security of computing system 400. Mailboxes 474 may also allow communication between client virtual machine 420 and management virtual machine 440.

An FPGA configuration and management block 476 in shell logic 411 on peripheral device 410 may include functions related to managing and configuring programmable circuits (e.g., FPGA) on peripheral device 410, such as client configurable circuit 414 and a reconfigurable shell of shell logic 411. For example, host 412 (e.g., management virtual machine 440) may send a transaction to FPGA configuration and management block 476 to initiate loading of the customer defined logic on client configurable circuit 414.

The division of these modules or blocks in shell logic 411 on peripheral device 410 between the static shell and the reconfigurable shell may depend on the design. In one embodiment, the static shell may include, for example, PCIe end point 450, PCIe mapping layer 452, FPGA configuration and management block 476, and mailbox(es) 474. The reconfigurable shell may include, for example, FPGA management layer 454, shell private fabric 470, private peripherals 472, etc.

Peripheral device 410 may also include shared peripherals 462 that may be accessible from either the control plane or the data plane. Shared peripherals 462 may include components that can have multiple address mappings. Examples of the shared peripherals may include a SerDes interface 464, a DRAM control 466 (e.g., DDR DRAM), a storage device control 468 (e.g., hard disk drives and solid-state drives), and other components that can be used to generate, store, or process information. Shared peripherals 462 may also include additional peripheral control. In some embodiments, shared peripherals 462 may be part of shell logic 411. In some implementations, shared peripherals 462 may be separate from shell logic 411.

As shown by 480 in FIG. 4, during the configuration (e.g., programming) of client configurable circuit 414 or the reconfigurable shell, customer defined logic within client configurable circuit 414 and client virtual machine 420 may be prevented (blocked) from communicating with each other or with the PCIe end point 450 through application driver 426. However, communications from FPGA management driver 434 of client virtual machine 420 to peripheral device 410 may continue through PCIe end point 450. This may allow client virtual machine 420 to communicate with management virtual machine 440 through mailboxes 474. Thus, client virtual machine 420 may still communicate with peripheral device 410 or management virtual machine 440 using the PCIe bus, but PCIe communications to client configurable circuit 414 are blocked.

There may be multiple ways to prevent client virtual machine 420 from communicating with the client configurable circuit 414 within peripheral device 410. One way is to pause or stop the virtual machine in a period during which the reconfigurable shell is reconfigured. Such a pausing of the virtual machine may last on the order of hundreds of milliseconds or longer. Management virtual machine 440 may control the pausing of client virtual machine 420 using known instructions. Another way to prevent communications between client virtual machine 420 and client configurable circuit 414 is to disable or detach application driver 426. Again, such disabling or deactivation can be controlled by management virtual machine 440. The disabling or deactivation of client configurable circuit 414 may be a hot unplug of client configurable circuit 414 from client virtual machine 420. The hot unplug may result in removing client configurable circuit 414 from a memory map of client virtual machine 420 so as to detach client configurable circuit 414 from client virtual machine 420. As shown in FIG. 4, disabling application driver 426 may prevent communication with client configurable circuit 414, but may not prevent FPGA management driver 434 from communicating with mailboxes 474. Thus, a portion of the communication channels between client virtual machine 420 and peripheral device 410 may be deactivated and the other portions may remain active.

Client configurable circuit 414 may also be prevented from communicating with client virtual machine 420. Such a prevention can occur by clearing or deactivating client configurable circuit 414. Deactivating client configurable circuit 414 may include blocking client configurable circuit 414 from communicating through the static shell, such as through the PCIe interface. Client configurable circuit 414 can also be blocked from using shared peripherals 462. By blocking client configurable circuit 414 from communicating with other circuits of computing system 400 during configuration of the reconfigurable shell, security for host 412 may be improved.

Preventing the communications between client virtual machine 420 and client configurable circuit 414 by pausing or stopping the virtual machine, disabling or detaching application driver 426, or clearing or deactivating client configurable circuit 414 as described above may cause significant disruption to client applications and/or degrade the efficiency of the computing system. For example, stopping the virtual machine may stop the user applications. Pausing the virtual machine may include saving the states of the virtual machine, and resuming the virtual machine after the reconfigurable shell switching may include restoring the states of the virtual machine. Disabling or detaching application driver to remove client configurable circuit from a memory map of the virtual machine may require remapping the client configurable circuit after the reconfigurable shell switching. Clearing or deactivating the client configurable circuit may require reconfiguring or reprogramming the client configurable circuit.

According to certain techniques disclosed herein, while the reconfigurable shell of the shell logic is being switched, the static shell may be configured to handle transaction requests from the client virtual machine and allow communications between the client virtual machine and a management virtual machine or hypervisor, such that the client virtual machine may remain active during the switching of the reconfigurable shell and can perform functions other than accessing the reconfigurable shell or the customer logic. In addition, the static shell may also ensure the security of the computing system by preventing the reconfigurable shell and client configurable circuit from communicating with the host and the static shell. The static shell may also include a state machine that can control the operation and timing of switching the reconfigurable shell and handle the transaction requests from the active client virtual machine.

Figure 5:
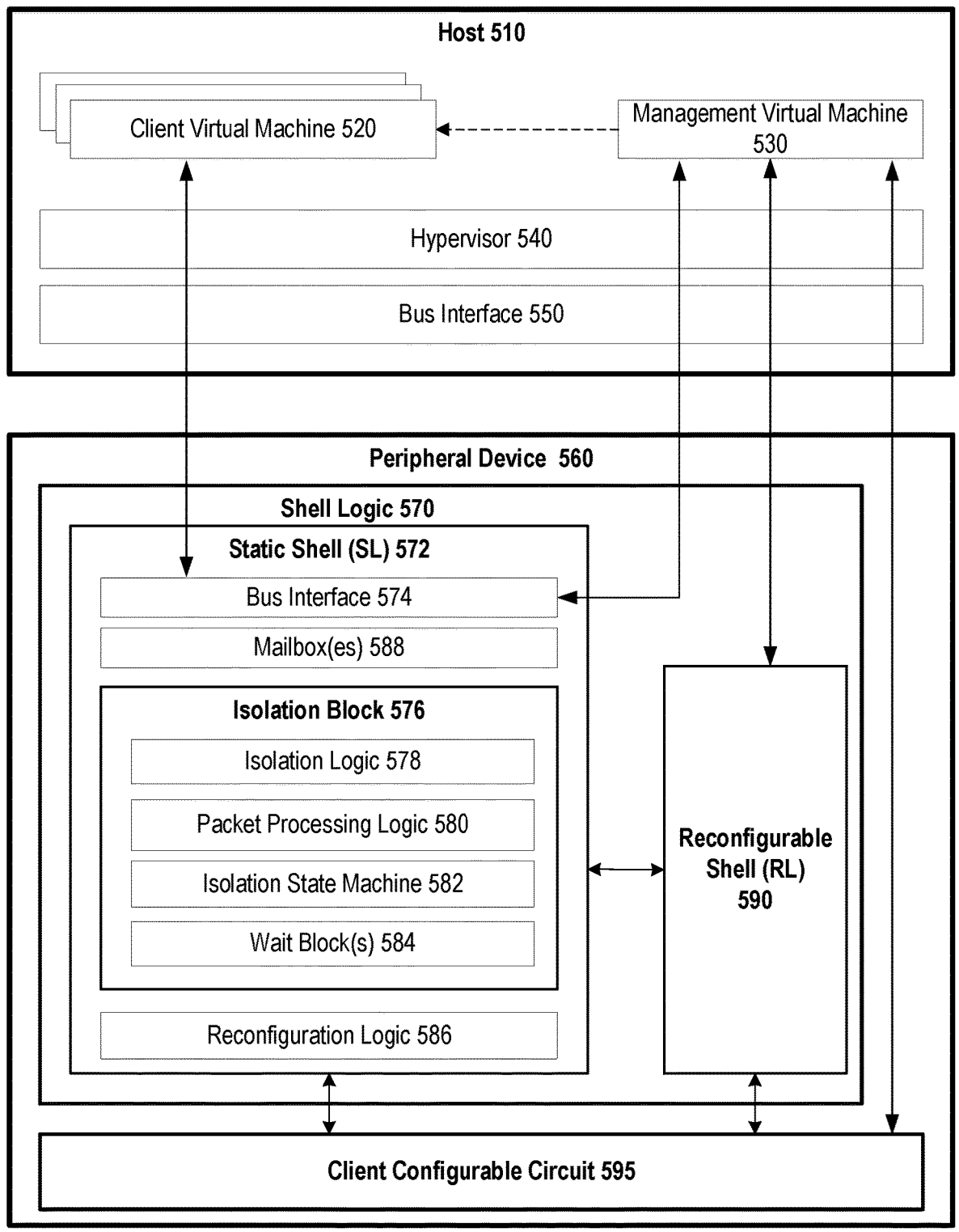
FIG. 5 illustrates an example computing system including a client configurable circuit and a shell logic that can be reconfigured when a client virtual machine is active, according to certain embodiments.

FIG. 5 illustrates an example computing system 500 including a client configurable circuit 595 and a shell logic 570 that can be reconfigured when a corresponding client virtual machine is active, according to certain embodiments. Computing system 500 may include a host 510 and a peripheral device 560, such as an end point. As with host 412 in computing system 400, host 510 may execute one or more client virtual machines 520 on a hypervisor 540 for communicating with the underlying hardware on host 510, such as a CPU, memory, and storage. As client virtual machine 420, client virtual machines 520 may execute various client applications. Hypervisor 540 may run directly on the host hardware to control the hardware and to manage the guest operating systems, or may run within an operating system environment. Examples of hypervisors may include Xen-based, Hyper-V, ESXi/ESX, Linux, or other hypervisors. Host 510 may also execute a management virtual machine 530 or a management hypervisor. Management virtual machine 530 may oversee and manage the configuration and operations of multiple client virtual machines 520. Host 510 may communicate with peripheral device 560 through a bus interface 550, such as a PCIe interface.

Peripheral device 560 may include the software and hardware components described above with respect to, for example, peripheral device 410 of FIG. 4, some of which may not be shown in FIG. 5 in order not to obscure the example embodiment in unnecessary detail. FIG. 5 shows that peripheral device 560 may include a shell logic 570 and a client configurable circuit 595, among other components that may not be shown in FIG. 5. Client configurable circuit 595 may include circuits that can be configured or programmed into the customer logic to perform a given function. For example, client configurable circuit 595 may include programmable logic blocks (e.g., FPGAs or PALs) comprising combinational logic and/or LUTs and sequential logic elements (such as flip-flops and/or latches), programmable routing and clocking resources, programmable distributed and block RAMs, digital signal processing (DSP) bit slices, and/or programmable input/output pins. Client configurable circuit 595 may be programmed or otherwise configured to implement customer defined logic, as described above with respect to, for example, FIGS. 3 and 4.

Shell logic 570 may wrap or encapsulate client configurable circuit 595, and may include multiple modules for configuring, managing, and communicating with client configurable circuit 595 as described above, even though some of them may not be shown in FIG. 5 in order not to obscure the example embodiment in unnecessary detail. Shell logic 570 may include a static shell 572, a reconfigurable shell 590, and a mailbox 588. In some implementations, mailbox 588 may be a part of static shell 572. Static shell 572 and mailbox 588 may be active during the operations of shell logic 570. As described above, mailbox 588 may be used as a bridge to enable communications between client virtual machines 520 and management virtual machine 530. Static shell 572 may include non-programmable circuits or programmable circuits that may be configured or initialized during a boot-up sequence, but may not be reconfigured during the operations of shell logic 570. Reconfigurable shell 590, on the other hand, may be reconfigured during the operations of peripheral device 560 and shell logic 570, for example, at the request of a client virtual machine 520 or management virtual machine 530.

When configured, reconfigurable shell 590 may act as the master of peripheral device 560 and may handle the requests from host 510 and client configurable circuit 595, such as memory access requests from client virtual machine during normal operations of shell logic 570 or memory access requests from client configurable circuit 595 to host 510. Reconfigurable shell 590 may also control the operation of static shell 572. For example, when a client virtual machine or the management virtual machine requests a new logic circuit for the reconfigurable shell, reconfigurable shell 590 may send a signal to static shell 572 to activate the portion of logic in static shell 572 that is responsible for handling reconfigurable shell switching.

In certain embodiments, static shell 572 may include minimal functionality to enable continuous communications between host 510 (e.g., client virtual machine 520) and peripheral device 560, to enable communications between management virtual machine 530 and client virtual machines 520, to isolate reconfigurable shell 590 from static shell 572 and host 510, to download shell configuration data and configure the reconfigurable shell using the shell configuration data, and to handle signaling and packet processing during the reconfiguration of reconfigurable shell 590. For example, static shell 572 may include a bus interface 574 for communicating with client virtual machine 520 and management virtual machine 530 on host 510; a reconfiguration logic 586 for downloading shell configuration data and configuring the reconfigurable shell using the shell configuration data; mailbox 588 for bridging the communications between management virtual machine 530 and client virtual machine 520; and an isolation block 576 that can be activated to isolate reconfigurable shell 590 from static shell 572 and handle signaling and packet processing during the reconfiguration of reconfigurable shell 590.

Bus interface 574 may include, for example, a PCIe core for implementing an interface between host 510 and peripheral device 560. Static shell 572 may receive through bus interface 574 requests for memory access and/or requests for configuring programmable circuit initiated from host 510 by, for example, client virtual machine 520 or management virtual machine 530. In some implementations, the PCIe core may include a buffer that may temporarily buffer the memory access requests from client virtual machine 520.

Reconfiguration logic 586 may download shell configuration data for a new logic circuit for the reconfigurable shell from, for example, a logic repository service (e.g., logic repository service 312). The new logic circuit for the reconfigurable shell may be provided by the computing service provider and may be in the form of, for example, a configuration file, a bit stream, a firmware, or a file in hardware description language. A logic circuit for the reconfigurable shell may be used for a type of customer logics. Reconfiguration logic 586 may configure the reconfigurable shell on certain programmable circuits on peripheral device 560 that may be reserved or allocated for reconfigurable shell 590 to configure the programmable circuits into the desired logic circuit for the reconfigurable shell for a client virtual machine.

Isolation block 576 may include an isolation logic 578, a packet processing logic 580, an isolation state machine 582, and one or more wait blocks 584. When activated, isolation logic 578 may gate the control or data signal to and from reconfigurable shell 590, or disconnect or block the interfaces between static shell 572 and reconfigurable shell 590, before reconfigurable shell 590 is reconfigured. After the shell configuration data for the new logic circuit for the reconfigurable shell is downloaded and ready to be implemented on the programmable circuits, isolation logic 578 may re-enable the interface between static shell 572 and reconfigurable shell 590 to enable loading and configuration of the new reconfigurable shell in the programmable circuits.

Packet processing logic 580 may be used to handle accesses (e.g., memory accesses) to peripheral device 560 from host 510 when reconfigurable shell 590 is isolated from static shell 572. In some implementations, packet processing logic 580 may be configured to differentiate requests from different entities (e.g., virtual machines) of computing system 500, different applications, or different buses, and handle them differently. For example, packet processing logic 580 may identify memory accesses from management virtual machine 530, such as memory accesses to static shell 572 or memory accesses from management virtual machine 530, and may allow such memory accesses from management virtual machine 530. Packet processing logic 580 may also identify access requests to access reconfigurable shell 590 or client configurable circuit 595 from the client virtual machines or other entities on host 510 and respond to the requests by returning, for example, default values or data patterns (such as a predetermined data pattern or a random data pattern) or other data that may not be meaningful for the client virtual machine, in order to keep the client virtual machine alive and not to starve the client virtual machine or the host. In some cases, requests from client virtual machine 520 to access mailbox 588 may be granted. In some implementations, packet processing logic 580 may also be used to generate control signals for controlling the logic blocks in static shell 572 when reconfigurable shell 590 is being configured.

Isolation state machine 582 may be used to implement a finite state machine (FSM) that may control the operations and timing of various functional blocks in isolation block 576 when the reconfigurable shell is being isolated or de-isolated (i.e., the reconfigurable shell isolation state changes) during the switching of reconfigurable shell 590. The FSM may be activated when the reconfigurable shell isolation state transitions from a non-isolation state to an isolation state or vice-versa. For example, when the management virtual machine requests a change in the reconfigurable shell isolation state, the FSM may stop accepting or may buffer memory accesses from the host. It may wait for all packets in flight to be processed. For example, it may allow the memory requests that have been issued but have not reached the reconfiguration logic to be completed. After the packets in flight have been processed, the reconfigurable shell isolation state may be switched from a disabled (non-isolation) state to an enabled (isolation) state before the reconfigurable shell is reconfigured. While the reconfigurable shell isolation is being enabled, the access requests to peripheral device 560 from host 510 may not be accepted or may be temporarily stored in a buffer, such as in the PCIe core. After the reconfigurable shell isolation state is switched to the enabled state (i.e., the reconfigurable shell is isolated from the static shell), the shell configuration data for the new logic circuit for the reconfigurable shell may be downloaded by reconfiguration logic 586, and the memory accesses from the host may be accepted and serviced, for example, by packet processing logic 580. After the shell configuration data is downloaded by reconfiguration logic 586, the FSM may control shell logic 570 to switch the reconfigurable shell isolation state from the enabled state to the disabled state such that the reconfigurable shell can be configured on the programmable circuits using the shell configuration data to implement the new logic circuit using the programming circuits. During the switching and configuration of the new reconfigurable shell, requests to access the reconfigurable shell or the client configurable logic may not be accepted or may be buffered. The FSM may also wait for the reconfigured reconfigurable shell to be ready before accepting accesses to the reconfigurable shell.

One or more wait blocks 584 may be used with the FSM. Wait blocks 584 may generate signals to control the FSM such that the FSM may wait for a certain period of time in certain states or wait until some pre-determined conditions are met. For example, one wait block 584 may control the pre-isolation wait to allow in-flight packets to be processed before enabling the reconfigurable shell isolation. Another wait block 584 may control the post-isolation wait to wait for the reconfigured reconfigurable shell to be ready before sending requests (e.g., memory access requests) to the reconfigurable shell. A third wait block 584 may be used to control the memory access wait time to allow memory accesses from the host to complete before changing the reconfigurable shell isolation state. In some implementations, the wait block may include a counter that can keep track of the number of in-flight packets or the number of pending memory accesses. In some implementations, the wait block may include a clock counter. In some implementations, the wait block may be configured to monitor, query, or receive the status of various functional blocks in peripheral device 560, such as reconfigurable shell 590 and packet processing logic 580, and generate a trigger signal to isolation state machine 582 based on the status of the various functional blocks in peripheral device 560.

Figure 6:
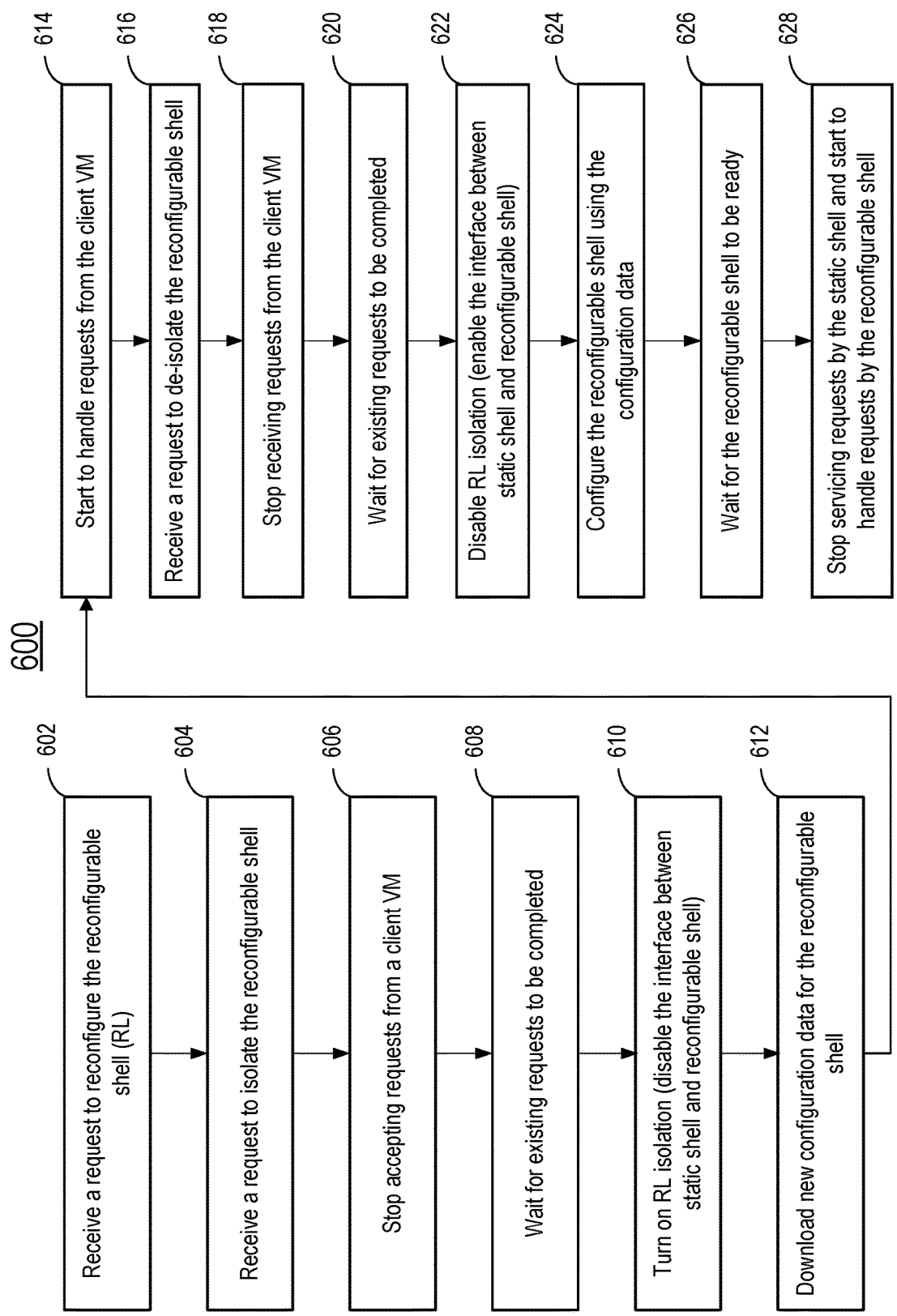
FIG. 6 is a flow chart illustrating an example method for configuring a configurable shell logic in a configurable computing system when a client virtual machine is active, according to certain embodiments.

FIG. 6 is a flow chart illustrating an example method 600 for configuring a reconfigurable shell in a configurable computing device (e.g., an end point or a peripheral device) when an associated client virtual machine is active, according to certain embodiments. In the example method, a request to start a reconfigurable shell isolation process may be received by a static shell of the configurable computing device. The static shell may enable the reconfigurable shell isolation by isolating the reconfigurable shell from the static shell (e.g., by gating data and control signals to and from the reconfigurable shell), such that the reconfigurable shell may not be able to communicate with the static shell. After the reconfigurable shell isolation is enabled, the reconfigurable shell configuration data may be downloaded. While the reconfigurable shell configuration data is downloaded, the static shell may process the requests to the shell logic (e.g., memory access requests). After the downloading of the reconfigurable shell configuration data completes, the reconfigurable shell isolation may be disabled to enable the interfaces between the static shell and reconfigurable shell. After reconfigurable shell isolation is disabled, the reconfigurable shell may be configured using the reconfigurable shell configuration data. Method 600 may be performed by, for example, peripheral device 560, and more specifically, shell logic 570 of FIG. 5.

At block 602, a shell logic of a client configurable device (e.g., a peripheral device, such as a PCIe end point, that includes programmable circuits, such as FPGAs) that includes a static shell and a reconfigurable shell may receive a request to switch or otherwise reconfigure the reconfigurable shell from a first logic circuit for performing a first function associated with a client virtual machine into a second logic circuit for performing a second function associated with the client virtual machine. The request may be originated from, for example, the client virtual machine or a management virtual machine executing on a host device communicatively coupled to the configurable computing device through, for example, PCI, PCIe, PCI-X, or AGP buses. For example, the client virtual machine may send a request to a management virtual machine for loading a different customer logic that may perform different functions. The management virtual machine may determine if a new logic circuit for the reconfigurable shell is needed. If a new logic circuit for the reconfigurable shell is needed, the management virtual machine may send a request to the shell logic to load the new logic circuit for the reconfigurable shell. For example, a client application using the client virtual machine may perform a memory mapping using DMA using a first customer logic at a first time period and may desire to use a second customer logic for a streaming process during a second time period. The first customer logic and the second customer logic may work within different logic circuits in the reconfigurable shells. In some cases, the request to reconfigure the reconfigurable shell may be originated from the management virtual machine, for example, for recovering a client virtual machine or reconfigurable shell from a failure caused by, for example, bug(s) in the reconfigurable shell. In some cases, the new logic circuit for the reconfigurable shell may be an updated version of the existing logic circuit for the reconfigurable shell with an improved function or efficiency.

At block 604, after receiving the request to switch or otherwise reconfigure the reconfigurable shell, the shell logic, for example, the reconfigurable shell, may send a request or an indication for isolating the reconfigurable shell to the static shell in the shell logic. The static shell may be configured when the client configurable device is booted and may not be changed during the operation of the client configurable device. The static shell may manage the switching of the reconfigurable shell.

At block 606, after receiving the request to isolate the reconfigurable shell, the static shell may start an isolation finite state machine (FSM). The isolation FSM may control the operations and timing of various functional blocks in an isolation block of the static shell when the reconfigurable shell isolation state changes during the switching of the reconfigurable shell. The FSM may stop accepting or temporarily buffer requests to access the configurable computing device from the host device, but may allow all packets in flight to be processed. For example, the isolation FSM may allow the memory requests that have been issued but have not reached the reconfiguration shell to be completed.

At block 608, the isolation FSM may wait for existing requests to be completed. In some implementations, the wait may be controlled by a wait block (e.g., wait block 584) to allow existing packets to be processed before enabling the reconfigurable shell isolation as described above.

At block 610, after the packets in flight have been processed, an isolation logic (e.g., isolation logic 578) may disable communications between the reconfigurable shell and the static shell (and thus between the reconfigurable shell and the client virtual machine or the host device) through, for example, gating the data and control signals to/from the reconfigurable shell or disabling the interface between the static shell and the reconfigurable shell. While the reconfigurable shell isolation is being enabled, the shell logic may stop accepting or temporarily buffer requests to access the configurable computing device from the host device. The isolation FSM may stop after the reconfigurable shell isolation is completed. When isolated, the reconfigurable shell may have no access to or from the static shell and the host device.

At block 612, after the reconfigurable shell is isolated from the static shell and the client virtual machine, a reconfiguration logic (e.g., reconfiguration logic 586) in the static shell may start to download shell configuration data for the new logic circuit for the reconfigurable shell from, for example, a logic repository service. The shell configuration data for the new logic circuit for the reconfigurable shell may be provided by a computing service provider. The shell configuration data may be in the form of a configuration file, a bit stream, a firmware, a file in hardware description language, etc.

At block 614, after the reconfigurable shell is isolated from the static shell and the client virtual machine, a packet processing logic (e.g., packet processing logic 580) may start to service any requests from the host. For example, during the downloading of the shell configuration data for the new logic circuit for the reconfigurable shell, the packet processing logic may handle requests from the host, such as from the client virtual machine or a management virtual machine. The packet processing logic may identify requests from different entities on the host device, different applications, or different buses and handle the requests differently. For example, the packet processing logic may identify access requests from the client virtual machine and respond to the requests (e.g., memory accesses) by returning, for example, default values or data patterns (such as a predetermined data pattern or a random data pattern) or other data that may not be associated with any client virtual machine, in order to keep the client virtual machine alive and not to starve the client virtual machine or the host. In some implementations, the packet processing logic may also identify memory accesses from the management virtual machine, such as memory accesses to the static shell or a mailbox (e.g., mailbox 588) from the management virtual machine, and may allow the memory accesses from the management virtual machine to be performed. Thus, during the downloading of the shell configuration data, the client virtual machine may be able to perform any operations other than accessing the reconfigurable shell.

At block 616, after the shell configuration data for the new logic circuit for the reconfigurable shell is downloaded, the static shell may receive a request to de-isolate the reconfigurable shell from the static shell and the host device.

At block 618, the isolation FSM may start again in order to change the reconfigurable shell isolation state from the enabled state to the disabled state. For example, the isolation FSM may stop accepting new access requests or may temporarily buffer the new access requests, but may allow the existing requests to be completed by the packet processing block.

At block 620, the isolation FSM may wait for the existing requests to be completed. As described above, a wait block may be used by the isolation FSM to control the wait time.

At block 622, after the existing requests have been completed, the isolation logic may disable the reconfigurable shell isolation by enabling the interface between static shell and reconfigurable shell. While the reconfigurable shell isolation is being disabled, the shell logic may stop accepting or temporarily buffer requests to access the configurable computing device from the host device.

At block 624, the reconfiguration logic may load the shell configuration data (e.g., bit stream) for the new logic circuit for the reconfiguration shell to the programmable circuits allocated for the reconfigurable shell to configure the reconfigurable shell using the shell configuration data.

At block 626, the static shell may wait for the reconfigured reconfigurable shell to be ready by using, for example, a wait block that controls the post-isolation wait as described above.

At block 628, after the reconfigured reconfigurable shell is ready, the static shell may stop servicing requests from the client virtual machine and the host device. The static shell may start to send the requests to the reconfigurable shell for handling the requests, such as memory accesses from the client virtual machine. In some implementations, a customer logic may be loaded to work with the reconfigured reconfigurable shell for the desired function.

Figure 7:
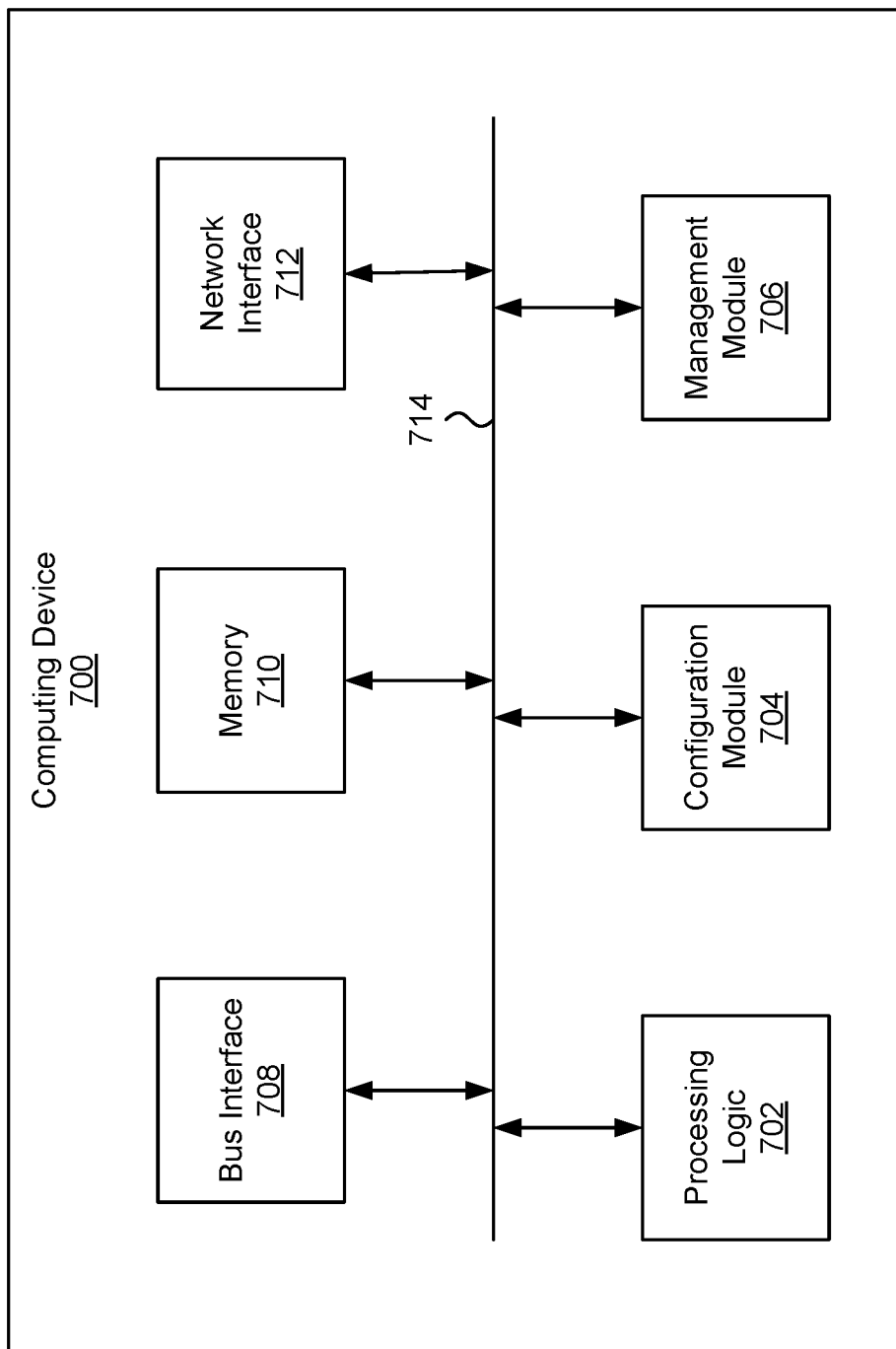
FIG. 7 illustrates an example of a computing device, according to certain aspects of the disclosure.

FIG. 7 illustrates an example of a computing device 700. Functionality and/or several components of the computing device 700 may be used without limitation with other embodiments disclosed elsewhere in this disclosure, without limitations. A computing device 700 may facilitate processing of packets and/or forwarding of packets from the computing device 700 to another device. As referred to herein, a "packet" or "network packet" may refer to a variable or fixed unit of data. In some instances, a packet may include a packet header and a packet payload. The packet header may include information associated with the packet, such as the source, destination, quality of service parameters, length, protocol, routing labels, error correction information, etc. In certain implementations, one packet header may indicate information associated with a series of packets, such as a burst transaction. In some implementations, the computing device 700 may be the recipient and/or generator of packets. In some implementations, the computing device 700 may modify the contents of the packet before forwarding the packet to another device. The computing device 700 may be a peripheral device coupled to another computing device, a switch, a router or any other suitable device enabled for receiving and forwarding packets.

In one example, the computing device 700 may include processing logic 702, a configuration module 704, a management module 706, a bus interface module 708, memory 710, and a network interface module 712. These modules may be hardware modules, software modules, or a combination of hardware and software. In certain instances, modules may be interchangeably used with components or engines, without deviating from the scope of the disclosure. The computing device 700 may include additional modules, not illustrated here, such as components discussed with respect to the nodes disclosed in FIG. 8. In some implementations, the computing device 700 may include fewer modules. In some implementations, one or more of the modules may be combined into one module. One or more of the modules may be in communication with each other over a communication channel 714. The communication channel 714 may include one or more busses, meshes, matrices, fabrics, a combination of these communication channels, or some other suitable communication channel.

The processing logic 702 may include application specific integrated circuits (ASICs), field programmable gate arrays (FPGAs), systems-on-chip (SoCs), network processing units (NPUs), processors configured to execute instructions or any other circuitry configured to perform logical arithmetic and floating point operations. Examples of processors that may be included in the processing logic 702 may include processors developed by ARM®, MIPS®, AMD®, Intel®, Qualcomm®, and the like. In certain implementations, processors may include multiple processing cores, wherein each processing core may be configured to execute instructions independently of the other processing cores. Furthermore, in certain implementations, each processor or processing core may implement multiple processing threads executing instructions on the same processor or processing core, while maintaining logical separation between the multiple processing threads. Such processing threads executing on the processor or processing core may be exposed to software as separate logical processors or processing cores. In some implementations, multiple processors, processing cores or processing threads executing on the same core may share certain resources, such as for example busses, level 1 (L1) caches, and/or level 2 (L2) caches. The instructions executed by the processing logic 702 may be stored on a computer-readable storage medium, for example, in the form of a computer program. The computer-readable storage medium may be non-transitory. In some cases, the computer-readable medium may be part of the memory 710.

The memory 710 may include either volatile or non-volatile, or both volatile and non-volatile types of memory. The memory 710 may, for example, include random access memory (RAM), read only memory (ROM), Electrically Erasable Programmable Read-Only Memory (EEPROM), flash memory, and/or some other suitable storage media. In some cases, some or all of the memory 710 may be internal to the computing device 700, while in other cases some or all of the memory may be external to the computing device 700. The memory 710 may store an operating system comprising executable instructions that, when executed by the processing logic 702, provides the execution environment for executing instructions providing networking functionality for the computing device 700. The memory may also store and maintain several data structures and routing tables for facilitating the functionality of the computing device 700.

In some implementations, the configuration module 704 may include one or more configuration registers. Configuration registers may control the operations of the computing device 700. In some implementations, one or more bits in the configuration register can represent certain capabilities of the computing device 700. Configuration registers may be programmed by instructions executing in the processing logic 702, and/or by an external entity, such as a host device, an operating system executing on a host device, and/or a remote device. The configuration module 704 may further include hardware and/or software that control the operations of the computing device 700.

In some implementations, the management module 706 may be configured to manage different components of the computing device 700. In some cases, the management module 706 may configure one or more bits in one or more configuration registers at power up, to enable or disable certain capabilities of the computing device 700. In certain implementations, the management module 706 may use processing resources from the processing logic 702. In other implementations, the management module 706 may have processing logic similar to the processing logic 702, but segmented away or implemented on a different power plane than the processing logic 702.

The bus interface module 708 may enable communication with external entities, such as a host device and/or other components in a computing system, over an external communication medium. The bus interface module 708 may include a physical interface for connecting to a cable, socket, port, or other connection to the external communication medium. The bus interface module 708 may further include hardware and/or software to manage incoming and outgoing transactions. The bus interface module 708 may implement a local bus protocol, such as Peripheral Component Interconnect (PCI) based protocols, Non-Volatile Memory Express (NVMe), Advanced Host Controller Interface (AHCI), Small Computer System Interface (SCSI), Serial Attached SCSI (SAS), Serial AT Attachment (SATA), Parallel ATA (PATA), some other standard bus protocol, or a proprietary bus protocol. The bus interface module 708 may include the physical layer for any of these bus protocols, including a connector, power management, and error handling, among other things. In some implementations, the computing device 700 may include multiple bus interface modules for communicating with multiple external entities. These multiple bus interface modules may implement the same local bus protocol, different local bus protocols, or a combination of the same and different bus protocols.

The network interface module 712 may include hardware and/or software for communicating with a network. This network interface module 712 may, for example, include physical connectors or physical ports for wired connection to a network, and/or antennas for wireless communication to a network. The network interface module 712 may further include hardware and/or software configured to implement a network protocol stack. The network interface module 712 may communicate with the network using a network protocol, such as for example TCP/IP, Infiniband, RoCE, Institute of Electrical and Electronics Engineers (IEEE) 802.11 wireless protocols, User Datagram Protocol (UDP), Asynchronous Transfer Mode (ATM), token ring, frame relay, High Level Data Link Control (HDLC), Fiber Distributed Data Interface (FDDI), and/or Point-to-Point Protocol (PPP), among others. In some implementations, the computing device 700 may include multiple network interface modules, each configured to communicate with a different network. For example, in these implementations, the computing device 700 may include a network interface module for communicating with a wired Ethernet network, a wireless 802.11 network, a cellular network, an Infiniband network, etc.

The various components and modules of the computing device 700, described above, may be implemented as discrete components, as a System on a Chip (SoC), as an ASIC, as an NPU, as an FPGA, or any combination thereof. In some embodiments, the SoC or other component may be communicatively coupled to another computing system to provide various services such as traffic monitoring, traffic shaping, computing, etc. In some embodiments of the technology, the SoC or other component may include multiple subsystems as disclosed with respect to FIG. 8.

Figure 8:
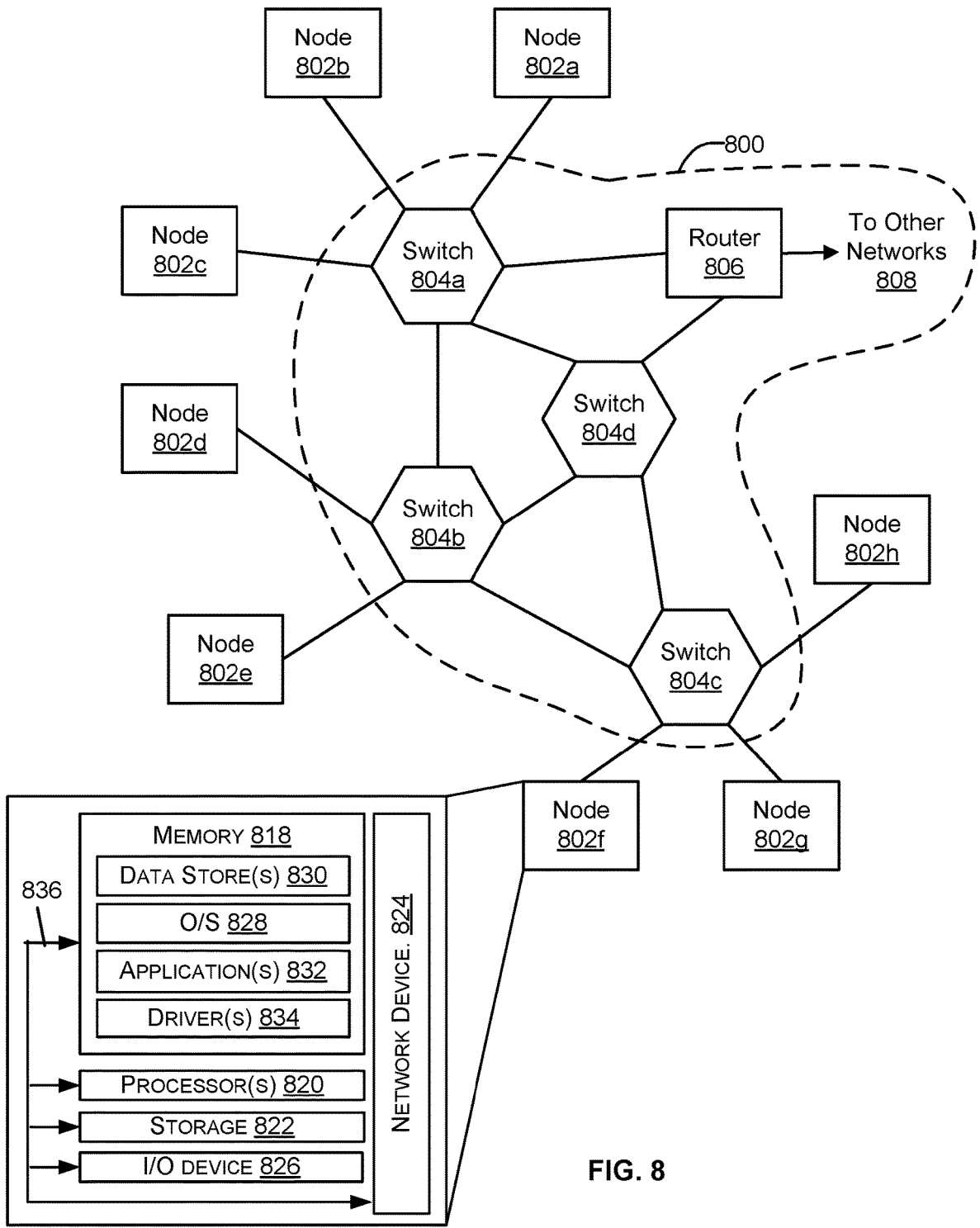
FIG. 8 illustrates an example architecture for features and systems described herein that includes one or more service provider computers and/or a user device connected via one or more networks, according to certain aspects of the disclosure.

FIG. 8 illustrates a network 800, illustrating various different types of computing devices 700 of FIG. 7, such as nodes comprising the network device, switches and routers. In certain embodiments, the network 800 may be based on a switched architecture with point-to-point links. As illustrated in FIG. 8, the network 800 includes a plurality of switches 804a-804d, which may be arranged in a network. In some cases, the switches are arranged in a multi-layered network, such as a Clos network. A computing device 700 that filters and forwards packets between local area network (LAN) segments may be referred to as a switch. Switches generally operate at the data link layer (layer 2) and sometimes the network layer (layer 3) of the Open System Interconnect (OSI) Reference Model and may support several packet protocols. Switches 804a-804d may be connected to a plurality of nodes 802a-802h and provide multiple paths between any two nodes.

The network 800 may also include one or more computing devices 700 for connection with other networks 808, such as other subnets, LANs, wide area networks (WANs), or the Internet, and may be referred to as routers 806. Routers use headers and forwarding tables to determine the best path for forwarding the packets, and use protocols such as internet control message protocol (ICMP) to communicate with each other and configure the best route between any two devices.

In some examples, network(s) 800 may include any one or a combination of many different types of networks, such as cable networks, the Internet, wireless networks, cellular networks and other private and/or public networks. Interconnected switches 804a-804d and router 806, if present, may be referred to as a switch fabric, a fabric, a network fabric, or simply a network. In the context of a computer network, terms "fabric" and "network" may be used interchangeably herein.

Nodes 802a-802h may be any combination of host systems, processor nodes, storage subsystems, and I/O chassis that represent user devices, service provider computers or third party computers.

User devices may include computing devices to access an application 832 (e.g., a web browser or mobile device application). In some aspects, the application 832 may be hosted, managed, and/or provided by a computing resources service or service provider. The application 832 may allow the user(s) to interact with the service provider computer(s) to, for example, access web content (e.g., web pages, music, video, etc.). The user device(s) may be a computing device such as for example a mobile phone, a smart phone, a personal digital assistant (PDA), a laptop computer, a netbook computer, a desktop computer, a thin-client device, a tablet computer, an electronic book (e-book) reader, a gaming console, etc. In some examples, the user device(s) may be in communication with the service provider computer(s) via the other network(s) 808. Additionally, the user device(s) may be part of the distributed system managed by, controlled by, or otherwise part of the service provider computer(s) (e.g., a console device integrated with the service provider computers).

The node(s) of FIG. 8 may also represent one or more service provider computers. One or more service provider computers may provide a native application that is configured to run on the user devices, which user(s) may interact with. The service provider computer(s) may, in some examples, provide computing resources such as, but not limited to, client entities, low latency data storage, durable data storage, data access, management, virtualization, cloud-based software solutions, electronic content performance management, and so on. The service provider computer(s) may also be operable to provide web hosting, databasing, computer application development and/or implementation platforms, combinations of the foregoing or the like to the user(s). In some embodiments, the service provider computer(s) may be provided as one or more virtual machines implemented in a hosted computing environment. The hosted computing environment may include one or more rapidly provisioned and released computing resources. These computing resources may include computing, networking and/or storage devices. A hosted computing environment may also be referred to as a cloud computing environment. The service provider computer(s) may include one or more servers, perhaps arranged in a cluster, as a server farm, or as individual servers not associated with one another and may host the application 832 and/or cloud-based software services. These servers may be configured as part of an integrated, distributed computing environment. In some aspects, the service provider computer(s) may, additionally or alternatively, include computing devices such as for example a mobile phone, a smart phone, a personal digital assistant (PDA), a laptop computer, a desktop computer, a netbook computer, a server computer, a thin-client device, a tablet computer, a gaming console, etc. In some instances, the service provider computer(s), may communicate with one or more third party computers.

In one example configuration, the node(s) 802a-802h may include at least one memory 818 and one or more processing units (or processor(s) 820). The processor(s) 820 may be implemented in hardware, computer-executable instructions, firmware, or combinations thereof. Computer-executable instruction or firmware implementations of the processor(s) 820 may include computer-executable or machine-executable instructions written in any suitable programming language to perform the various functions described.

In some instances, the hardware processor(s) 820 may be a single core processor or a multi-core processor. A multi-core processor may include multiple processing units within the same processor. In some embodiments, the multi-core processors may share certain resources, such as buses and second or third level caches. In some instances, each core in a single or multi-core processor may also include multiple executing logical processors (or executing threads). In such a core (e.g., those with multiple logical processors), several stages of the execution pipeline and also lower level caches may also be shared.

The memory 818 may store program instructions that are loadable and executable on the processor(s) 820, as well as data generated during the execution of these programs. Depending on the configuration and type of the node(s) 802*a*-802*h*, the memory 818 may be volatile (such as RAM) and/or non-volatile (such as ROM, flash memory, etc.). The memory 818 may include an operating system 828, one or more data stores 830, one or more application programs 832, one or more drivers 834, and/or services for implementing the features disclosed herein.

The operating system 828 may support nodes 802*a*-802*h* basic functions, such as scheduling tasks, executing applications, and/or controller peripheral devices. In some implementations, a service provider computer may host one or more virtual machines. In these implementations, each virtual machine may be configured to execute its own operating system. Examples of operating systems include Unix, Linux, Windows, Mac OS, iOS, Android, and the like. The operating system 828 may also be a proprietary operating system.

The data stores 830 may include permanent or transitory data used and/or operated on by the operating system 828, application programs 832, or drivers 834. Examples of such data include web pages, video data, audio data, images, user data, and so on. The information in the data stores 830 may, in some implementations, be provided over the network(s) 808 to user devices 804. In some cases, the data stores 830 may additionally or alternatively include stored application programs and/or drivers. Alternatively or additionally, the data stores 830 may store standard and/or proprietary software libraries, and/or standard and/or proprietary application user interface (API) libraries. Information stored in the data stores 830 may be machine-readable object code, source code, interpreted code, or intermediate code.

The drivers 834 include programs that may provide communication between components in a node. For example, some drivers 834 may provide communication between the operating system 828 and additional storage 822, network device 824, and/or I/O device 826. Alternatively or additionally, some drivers 834 may provide communication between application programs 832 and the operating system 828, and/or application programs 832 and peripheral devices accessible to the service provider computer. In many cases, the drivers 834 may include drivers that provide well-understood functionality (e.g., printer drivers, display drivers, hard disk drivers, Solid State Device drivers). In other cases, the drivers 834 may provide proprietary or specialized functionality.

The service provider computer(s) or servers may also include additional storage 822, which may include removable storage and/or non-removable storage. The additional storage 822 may include magnetic storage, optical disks, solid state disks, flash memory, and/or tape storage. The additional storage 822 may be housed in the same chassis as the node(s) 802*a*-802*h* or may be in an external enclosure. The memory 818 and/or additional storage 822 and their associated computer-readable media may provide non-volatile storage of computer-readable instructions, data structures, program modules, and other data for the computing devices. In some implementations, the memory 818 may include multiple different types of memory, such as SRAM, DRAM, or ROM.

The memory 818 and the additional storage 822, both removable and non-removable, are examples of computer-readable storage media. For example, computer-readable storage media may include volatile or non-volatile, removable or non-removable media implemented in a method or technology for storage of information, the information including, for example, computer-readable instructions, data structures, program modules, or other data. The memory 818 and the additional storage 822 are examples of computer storage media. Additional types of computer storage media that may be present in the node(s) 802*a*-802*h* may include, but are not limited to, PRAM, SRAM, DRAM, RAM, ROM, EEPROM, flash memory or other memory technology, CD-ROM, DVD or other optical storage, magnetic cassettes, magnetic tape, magnetic disk storage or other magnetic storage devices, solid state drives, or some other medium which can be used to store the desired information and which can be accessed by the node(s) 802*a*-802*h*. Computer-readable media also includes combinations of any of the above media types, including multiple units of one media type.

Alternatively or additionally, computer-readable communication media may include computer-readable instructions, program modules or other data transmitted within a data signal, such as a carrier wave or other transmission. However, as used herein, computer-readable storage media does not include computer-readable communication media.

The node(s) 802*a*-802*h* may also include I/O device(s) 826, such as a keyboard, a mouse, a pen, a voice input device, a touch input device, a display, speakers, a printer, and the like. The node(s) 802*a*-802*h* may also include one or more communication channels 836. A communication channel 836 may provide a medium over which the various components of the node(s) 802*a*-802*h* can communicate. The communication channel or channels 836 may take the form of a bus, a ring, a switching fabric, or a network.

The node(s) 802*a*-802*h* may also contain network device(s) 824 that allow the node(s) 802*a*-802*h* to communicate with a stored database, another computing device or server, user terminals and/or other devices on the network(s) 800. The network device(s) 824 of FIG. 8 may include similar components discussed with reference to the computing device 700 of FIG. 7.

In some implementations, the network device 824 is a peripheral device, such as a PCI-based device. In these implementations, the network device 824 includes a PCI interface for communicating with a host device. The term "PCI" or "PCI-based" may be used to describe any protocol in the PCI family of bus protocols, including the original PCI standard, PCI-X, Accelerated Graphics Port (AGP), and PCI-Express (PCIe) or any other improvement or derived protocols that are based on the PCI protocols discussed herein. The PCI-based protocols are standard bus protocols for connecting devices, such as a local peripheral device to a host device. A standard bus protocol is a data transfer protocol for which a specification has been defined and adopted by various manufacturers. Manufacturers ensure that compliant devices are compatible with computing systems implementing the bus protocol, and vice versa. As used herein, PCI-based devices also include devices that communicate using Non-Volatile Memory Express (NVMe). NVMe is a device interface specification for accessing non-volatile storage media attached to a computing system using PCIe. For example, the bus interface module 708 may implement NVMe, and the network device 824 may be connected to a computing system using a PCIe interface.

A PCI-based device may include one or more functions. A "function" describes operations that may be provided by the network device 824. Examples of functions include mass storage controllers, network controllers, display controllers, memory controllers, serial bus controllers, wireless controllers, and encryption and decryption controllers, among others. In some cases, a PCI-based device may include more than one function. For example, a PCI-based device may provide a mass storage controller and a network adapter. As another example, a PCI-based device may provide two storage controllers, to control two different storage resources. In some implementations, a PCI-based device may have up to eight functions.

In some implementations, the network device 824 may include single-root I/O virtualization (SR-IOV). SR-IOV is an extended capability that may be included in a PCI-based device. SR-IOV allows a physical resource (e.g., a single network interface controller) to appear as multiple resources (e.g., sixty-four network interface controllers). Thus, a PCI-based device providing a certain functionality (e.g., a network interface controller) may appear to a device making use of the PCI-based device to be multiple devices providing the same functionality. The functions of an SR-IOV-capable storage adapter device may be classified as physical functions (PFs) or virtual functions (VFs). Physical functions are fully featured functions of the device that can be discovered, managed, and manipulated. Physical functions have configuration resources that can be used to configure or control the storage adapter device. Physical functions include the same configuration address space and memory address space that a non-virtualized device would have. A physical function may have a number of virtual functions associated with it. Virtual functions are similar to physical functions, but are light-weight functions that may generally lack configuration resources, and are generally controlled by the configuration of their underlying physical functions. Each of the physical functions and/or virtual functions may be assigned to a respective thread of execution (such as for example, a virtual machine) running on a host device.

The modules described herein may be software modules, hardware modules or a suitable combination thereof. If the modules are software modules, the modules can be embodied on a non-transitory computer readable medium and processed by a processor in any of the computer systems described herein. It should be noted that the described processes and architectures can be performed either in real-time or in an asynchronous mode prior to any user interaction. The modules may be configured in the manner suggested in FIG. 7, FIG. 8, and/or functions described herein can be provided by one or more modules that exist as separate modules and/or module functions described herein can be spread over multiple modules.

The specification and drawings are, accordingly, to be regarded in an illustrative rather than a restrictive sense. It will, however, be evident that various modifications and changes may be made thereunto without departing from the broader spirit and scope of the disclosure as set forth in the claims.

Other variations are within the spirit of the present disclosure. Thus, while the disclosed techniques are susceptible to various modifications and alternative constructions, certain illustrated embodiments thereof are shown in the drawings and have been described above in detail. It should be understood, however, that there is no intention to limit the disclosure to the specific form or forms disclosed, but on the contrary, the intention is to cover all modifications, alternative constructions, and equivalents falling within the spirit and scope of the disclosure, as defined in the appended claims.

The use of the terms "a" and "an" and "the" and similar referents in the context of describing the disclosed embodiments (especially in the context of the following claims) are to be construed to cover both the singular and the plural, unless otherwise indicated herein or clearly contradicted by context. The terms "comprising," "having," "including," and "containing" are to be construed as open-ended terms (i.e., meaning "including, but not limited to,") unless otherwise noted. The term "connected" is to be construed as partly or wholly contained within, attached to, or joined together, even if there is something intervening. Recitation of ranges of values herein are merely intended to serve as a shorthand method of referring individually to each separate value falling within the range, unless otherwise indicated herein and each separate value is incorporated into the specification as if it were individually recited herein. All methods described herein can be performed in any suitable order unless otherwise indicated herein or otherwise clearly contradicted by context. The use of any and all examples, or exemplary language (e.g., "such as") provided herein, is intended merely to better illuminate embodiments of the disclosure and does not pose a limitation on the scope of the disclosure unless otherwise claimed. No language in the specification should be construed as indicating any non-claimed element as essential to the practice of the disclosure.

Disjunctive language such as the phrase "at least one of X, Y, or Z," unless specifically stated otherwise, is intended to be understood within the context as used in general to present that an item, term, etc., may be either X, Y, or Z, or any combination thereof (e.g., X, Y, and/or Z). Thus, such disjunctive language is not generally intended to, and should not, imply that certain embodiments require at least one of X, at least one of Y, or at least one of Z to each be present.

Various embodiments of this disclosure are described herein, including the best mode known to the inventors for carrying out the disclosure. Variations of those embodiments may become apparent to those of ordinary skill in the art upon reading the foregoing description. The inventors expect skilled artisans to employ such variations as appropriate and the inventors intend for the disclosure to be practiced otherwise than as specifically described herein. Accordingly, this disclosure includes all modifications and equivalents of the subject matter recited in the claims appended hereto as permitted by applicable law. Moreover, any combination of the above-described elements in all possible variations thereof is encompassed by the disclosure unless otherwise indicated herein or otherwise clearly contradicted by context.

What is claimed is:

1. A computing system comprising:
 a host device configured to execute a client virtual machine and a management virtual machine; and
 a peripheral device comprising a field programmable gate array (FPGA) and communicatively coupled to the host device, the peripheral device comprising:

a client configurable circuit in the FPGA, the client configurable circuit configurable according to client configuration data to perform a user function; and
a shell logic implemented using the FPGA and configured to isolate the client configurable circuit based on restricting access of the client configurable circuit to other components of the peripheral device when the client configurable circuit performs the user function, the shell logic comprising a static shell and a reconfigurable shell,
wherein the reconfigurable shell includes a host reconfigurable circuit that is configurable into a first logic circuit for performing a first function and into a second logic circuit for performing a second function;
wherein the static shell comprises:
an isolation logic;
a reconfiguration logic;
a packet processing logic; and
wherein the static shell is configured to, while the client virtual machine is active, and responsive to receiving a request to reconfigure the host reconfigurable circuit:
disable, by the isolation logic, communication between the reconfigurable shell and the static shell;
start to service, by the packet processing logic, transactions with the client virtual machine and the management virtual machine when the communication between the reconfigurable shell and the static shell is disabled to enable the client virtual machine and the management virtual machine to perform operations without accessing the reconfigurable shell;
obtain, by the reconfiguration logic, shell configuration data associated with the second logic circuit;
enable, by the isolation logic, the communication between the reconfigurable shell and the static shell; and
configure, by the reconfiguration logic, the host reconfigurable circuit into the second logic circuit using the shell configuration data.

2. The computing system of claim 1, wherein:
the peripheral device further comprises a bus interface communicatively coupled to the host device; and
the static shell further comprises an isolation state machine configured to control the static shell to:
stop accepting transaction requests from the bus interface;
allow transaction requests that have already been accepted to be processed using the reconfigurable shell;
control the isolation logic to disable, after the transaction requests that have already been accepted are processed, the communication between the reconfigurable shell and the static shell; and
accept, when the communication between the reconfigurable shell and the static shell is disabled, transaction requests from the bus interface.

3. The computing system of claim 2, wherein the static shell further comprises a wait block, the wait block configured to:
monitor a status of the reconfigurable shell, wherein the status indicates:
whether the transaction requests that have already been accepted from the bus interface have been processed; or
whether the reconfigurable shell is ready to perform the second function; and
send a trigger signal to the isolation state machine based on the status of the reconfigurable shell.

4. The computing system of claim 1, wherein the static shell further comprises a mailbox configured to enable communication between the client virtual machine and the management virtual machine via the static shell.

5. A configurable device comprising:
a client configurable circuit that is configurable according to client configuration data to perform a user function associated with a client virtual machine;
a shell logic comprising circuits configured to control access of the client configurable circuit to other components of the configurable device when the client configurable circuit performs the user function, the circuits of the shell logic comprising:
a reconfigurable shell including a host configurable circuit;
an isolation logic configured to, when the reconfigurable shell is being reconfigured from a first logic circuit associated with a first function into a second logic circuit associated with a second function, disable communication between the reconfigurable shell and the client virtual machine; and
a packet processing logic configured to, when the communication between the reconfigurable shell and the client virtual machine is disabled by the isolation logic, and responsive to the shell logic receiving a request to reconfigure the host configurable circuit, service transactions between the client virtual machine and the configurable device to enable the client virtual machine to perform an operation without accessing the reconfigurable shell; and
a reconfiguration logic configured to reconfigure the reconfigurable shell from the first logic circuit to the second logic circuit.

6. The configurable device of claim 5, wherein the shell logic includes the reconfiguration logic; and
wherein the reconfiguration logic is configured to:
obtain shell configuration data associated with the second logic circuit; and
configure the reconfigurable shell using the shell configuration data associated with the second logic circuit.

7. The configurable device of claim 6, wherein:
the shell logic includes a static shell that includes the isolation logic and the reconfiguration logic; and
the isolation logic is configured to disable communication between the reconfigurable shell and the client virtual machine by disabling communication between the reconfigurable shell and the static shell.

8. The configurable device of claim 5, wherein the shell logic further comprises an isolation state machine configured to control the shell logic to:
stop accepting transaction requests from the client virtual machine to the configurable device;
allow transaction requests that have been accepted from the client virtual machine to be processed using the reconfigurable shell;
control the isolation logic to disable, after the transaction requests that have been accepted are processed, the communication between the reconfigurable shell and the client virtual machine; and
start to service, by the packet processing logic and when the communication between the reconfigurable shell and the client virtual machine is disabled, transaction requests from the client virtual machine.

9. The configurable device of claim 8, wherein the shell logic further comprises a wait block configured to:
monitor a status of the reconfigurable shell, wherein the status of the reconfigurable shell indicates:

whether the transaction requests that have been accepted from the client virtual machine have been processed; or whether the reconfigurable shell is ready to perform the second function; and send a trigger signal to the isolation state machine based on the status of the reconfigurable shell.

10. The configurable device of claim 5, wherein the isolation logic further comprises an isolation state machine configured to:

stop accepting transaction requests from the client virtual machine;

allow transaction requests that have been accepted from the client virtual machine to be serviced using the packet processing logic;

control the isolation logic to enable the communication between the reconfigurable shell and other circuits of the shell logic;

configure the reconfigurable shell using shell configuration data associated with the second logic circuit; and start to process, using the reconfigurable shell and after the reconfigurable shell is configured using the shell configuration data, transaction requests from the client virtual machine.

11. The configurable device of claim 5, wherein the shell logic further comprises a mailbox configured to enable communication between the client virtual machine and a management virtual machine via the shell logic, the management virtual machine configured to control the shell logic.

12. The configurable device of claim 11, wherein the packet processing logic is configured to, when the communication between the reconfigurable shell and the client virtual machine is disabled by the isolation logic, enable the management virtual machine to access the mailbox.

13. The configurable device of claim 5, wherein the packet processing logic is configured to service the transactions between the client virtual machine and the configurable device by returning a default data pattern to the client virtual machine.

14. The configurable device of claim 13, wherein the packet processing logic is configured to return the default data pattern to the client virtual machine based on identifying an access request from the client virtual machine; and wherein the default data pattern is not associated with any client virtual machine and is configured to prevent the client virtual machine from being starved of data.

15. The configurable device of claim 5, wherein the configurable device includes a field programmable gate array (FPGA) including the client configurable circuit and the host configurable circuit.

16. The configurable device of claim 15, wherein the FPGA includes the shell logic.

17. The configurable device of claim 5, further comprising a bus interface configured to receive and buffer transaction requests sent to the configurable device.

18. The configurable device of claim 5, wherein the reconfigurable shell is configured to control communications between the client virtual machine and the client configurable circuit.

19. The configurable device of claim 5, further comprising a first FPGA and a second FPGA, the shell logic being implemented on the first FPGA and the client configurable circuit being implemented on the second FPGA.

20. The configurable device of claim 5, wherein the client virtual machine is a management virtual machine; and wherein the packet processing logic is configured to:
receive an access request from the management virtual machine; and responsive to determining that the access request is a request to access a memory, service the transactions based on providing the management virtual machine with access to the memory.

21. A method comprising:

receiving, by a shell logic of a configurable device, a request to reconfigure a reconfigurable shell of the shell logic from a first logic circuit for performing a first function into a second logic circuit for performing a second function, wherein:

the configurable device further includes a client configurable circuit; and the shell logic is configured to control access of the client configurable circuit to other components of the configurable device when the client configurable circuit performs a third function associated with a client virtual machine;

responsive to receiving the request, disabling, by an isolation logic of the shell logic, communication between the reconfigurable shell and the client virtual machine;

servicing, by a packet processing logic of the shell logic and while the communication between the reconfigurable shell and the client virtual machine is disabled, transactions between the client virtual machine and the configurable device to enable the client virtual machine to perform operations without accessing the reconfigurable shell; and reconfiguring, by a reconfiguration logic of the configurable device, the reconfigurable shell from the first logic circuit to the second logic circuit.

22. The method of claim 21, further comprising:

stopping, after receiving the request to configure the reconfigurable shell, accepting transaction requests from the client virtual machine; and processing, using the reconfigurable shell and before disabling the communication between the reconfigurable shell and the client virtual machine, transaction requests that have already been accepted from the client virtual machine.

23. The method of claim 21, further comprising:

obtaining, after disabling the communication between the reconfigurable shell and the client virtual machine, shell configuration data associated with the second logic circuit.

24. The method of claim 23, further comprising:

stopping, after obtaining the shell configuration data associated with the second logic circuit, accepting transaction requests from the client virtual machine;

servicing the transaction requests from the client virtual machine that have already been accepted;

enabling, after servicing the transaction requests from the client virtual machine that have already been accepted, the communication between the reconfigurable shell and other circuits of the shell logic; and configuring, by the reconfiguration logic, the reconfigurable shell using the shell configuration data associated with the second logic circuit, wherein the reconfiguration logic is part of the shell logic.

25. The method of claim 24, further comprising:

accepting, after configuring the reconfigurable shell, transaction requests from the client virtual machine; and starting to processing, using the reconfigurable shell, the transaction requests from the client virtual machine.

26. The method of claim 24, further comprising:
configuring, after configuring the reconfigurable shell and using client configuration data for a user function, the client configurable circuit to perform the user function.

27. The method of claim 21, further comprising:
enabling, by the shell logic, communication between the client virtual machine and a management virtual machine, the management virtual machine configured to control the shell logic.

* * * * *